United States Patent
Sasaki et al.

(10) Patent No.: US 10,515,778 B2
(45) Date of Patent: Dec. 24, 2019

(54) SECONDARY PARTICLE DETECTION SYSTEM OF SCANNING ELECTRON MICROSCOPE

(71) Applicant: NGR Inc., Yokohama (JP)

(72) Inventors: Sumio Sasaki, Yokohama (JP); Susumu Takashima, Yokohama (JP); Makoto Kato, Yokohama (JP); Kazufumi Kubota, Yokohama (JP); Yukihiro Tanaka, Yokohama (JP); Yuichiro Yamazaki, Yokohama (JP)

(73) Assignee: NGR INC., Yokohama (JP)

( * ) Notice: Subject to any disclaimer, the term of this patent is extended or adjusted under 35 U.S.C. 154(b) by 916 days.

(21) Appl. No.: 15/071,526

(22) Filed: Mar. 16, 2016

(65) Prior Publication Data
US 2017/0271124 A1 Sep. 21, 2017

(51) Int. Cl.
*H01J 37/244* (2006.01)
*H01J 37/28* (2006.01)
*H01J 37/26* (2006.01)
*H01J 37/147* (2006.01)

(52) U.S. Cl.
CPC ........ *H01J 37/244* (2013.01); *H01J 37/1474* (2013.01); *H01J 37/263* (2013.01); *H01J 37/28* (2013.01); *H01J 2237/103* (2013.01); *H01J 2237/2448* (2013.01); *H01J 2237/2801* (2013.01)

(58) Field of Classification Search
CPC ............. H01J 37/244; H01J 2237/2449; H01J 37/147; H01J 2237/2443; H01J 2237/24475; H01J 2237/2448
See application file for complete search history.

(56) References Cited

U.S. PATENT DOCUMENTS

| | | | |
|---|---|---|---|
| 6,455,848 B1 | 9/2002 | Krijn et al. | |
| 6,717,141 B1* | 4/2004 | Rouse | H01J 37/153 250/305 |
| 7,462,828 B2* | 12/2008 | Fukada | G01N 23/2251 250/306 |
| 8,153,969 B2 | 4/2012 | Fukada et al. | |
| 8,895,935 B2 | 11/2014 | Wang et al. | |
| 2008/0099673 A1* | 5/2008 | Fukuda | H01J 7/244 250/307 |
| 2009/0309022 A1* | 12/2009 | Gunji | G01N 23/2251 250/307 |

(Continued)

*Primary Examiner* — Brooke Purinton
(74) *Attorney, Agent, or Firm* — Lathrop Gage LLP

(57) ABSTRACT

A scanning electron microscope includes: a retarding power source configured to apply a retarding voltage to a specimen; a combined objective lens configured to focus the primary beam on a surface of the specimen; an electrostatic deflection system configured to deflect the primary beam to direct the primary beam to each point in a field of view on the surface of the specimen; a first scintillation detector having a first scintillator configured to emit light upon incidence of secondary electrons which have been emitted from the specimen; a Wien filter configured to deflect the secondary electrons in one direction without deflecting the primary beam; and a second scintillation detector having a second scintillator configured to detect the secondary electrons deflected by the Wien filter. The second scintillator has a distal end located away from the axis of the primary beam.

16 Claims, 15 Drawing Sheets

(56) References Cited

U.S. PATENT DOCUMENTS

2011/0049361 A1* 3/2011 Preikszas .............. H01J 37/09
250/306
2013/0082175 A1* 4/2013 Jaksch .............. G01N 23/2251
250/307

* cited by examiner

SECONDARY PARTICLE DETECTION SYSTEM OF SCANNING ELECTRON MICROSCOPE

BACKGROUND

As microfabrication of semiconductor devices has advanced, pattern sizes have decreased less than one-several tens of a wavelength of light, thus revealing a limit of resolution in inspection using an optical microscope. A scanning electron microscope (SEM) can observe patterns with a high resolution because the wavelength of electrons is short as compared with the pattern sizes. Therefore, the scanning electron microscope has been widely used for semiconductor inspection. In recent years, however, patterns have become smaller and finer, and accordingly, a demand for the resolution of the scanning electron microscope has been increasing year by year. Furthermore, there is a demand for high-speed scanning over a large area in order to meet a requirement of a high throughput. Therefore beam current of 1 nA or more is becoming indispensable for obtaining a sufficient SN ratio in a short time.

Generally, the higher an acceleration voltage for a primary beam increases, the higher a brightness of a light source becomes, thus achieving a higher resolution of the scanning electron microscope. However, the high acceleration voltage results in heavier damage to devices, besides a problem of shrinkage when observing resist patterns, it has been required to observe semiconductor devices with a landing energy of 5 keV or lower. In the scanning electron microscope, if the acceleration voltage is low, a coulomb interaction occurs noticeably depending on the increase of the beam current. As a result, the coulomb interaction in a beam path causes the primary beam to spread more greatly than an optical aberration, thus lowering the resolution.

There are strong needs, as technical tasks, for a future pattern observation to overcome the above-discussed drawbacks and to achieve the following five objects simultaneously, i.e., 1) a low landing energy of at most 5 keV, 2) a high resolution, 3) a high beam current, 4) high-speed scanning, and 5) a large field of view (FOV) of 100 μm.

Multilayered patterns have also been advancing, as well as the microfabricated patterns. With this trend, there are also strong demands of observing minute positional misalignment of patterns between upper and lower layers and observing a bottom of a contact hole having a high aspect ratio. In order to accommodate these needs, it is necessary to use an acceleration voltage enabling a high penetrating power and to observe back-scattered electrons having appropriate energies determined depending on a depth from a surface of an observation target. For realizing this, it is effective to observe not only secondary electrons, but also back-scattered electrons whose amount of energy loss has been specified.

The present invention has been made to provide a scanning electron microscope capable of achieving the following seven objects, which are:

(1) to use a low landing energy of not more than 5 keV which can avoid damage to semiconductor devices;

(2) to achieve a large FOV of 100 μm;

(3) to achieve a high-speed scanning of 100 MHz or higher;

(4) to use a large beam current of at least 1 nA capable of achieving a sufficient SN ratio (signal-to-noise ratio) even at a pixel rate of 100 MHz;

(5) to observe a target object with a probe size of not more than 2 nm which can detect a defect having a size of several nanometers;

(6) to use a high acceleration voltage of 50 kV to increase a depth by which a primary beam can penetrate into a specimen for enabling acquisition of information carried by back-scattered electrons; and (7) to specify a depth at which the back-scattered electrons (BSE) are generated by selecting a detection energy for the back-scattered electrons (BSE) in order to enable selection of the specified depth information.

The prior art related to a method of detecting the secondary particles includes laid-open patent publications U.S. Pat. Nos. 7,462,828, 8,153,969. According to these documents, as shown in FIG. 17, an electron beam 200 is illuminated to a specimen 203 transmitting through a condenser lens CL1, an aperture 201, a condenser lens CL2, and an objective lens 202. A target plate 205, which is grounded, is disposed on a beam axis. Secondary particles collide with the target plate 205, so that secondary electrons (which may be referred to as tertiary electrons) are emitted from the target plate 205. The secondary electrons are attracted by an attraction force of an electrostatic field created by applying a positive voltage of about 10 KV to a scintillator 206 which is arranged far away from the beam axis, and are detected by the scintillator 206.

The detection method using the target plate 205 generally has three disadvantages.

The first disadvantage is that when the energy of the secondary particles (i.e., the secondary electrons and the back-scattered electrons), which enter the target plate 205, exceeds about 2 KeV, a secondary electron yield (which may to be referred to as tertiary electrons) of the target plate 205 becomes smaller than 1. For example, when the energy of the secondary particles is 10 keV, the secondary (tertiary) electron yield decreases to 0.5 or less. The tertiary electrons are directed to the scintillator 206, causing the scintillator 206 to emit light. The light is reduced while traveling through a light guide 207. Further, the light is transmitted to a photo-multiplier tube (PMT) 208, where the light is converted into electrons and multiplied. Through these processes, the SN ratio considerably deteriorates, as discussed below.

Target-type signal detection processes include conversion processes in several stages. First, the secondary electrons, which are signal sources, collide with the target plate 205, and tertiary electrons are emitted. The tertiary electrons are accelerated and enter the scintillator 206, where the tertiary electrons are converted into light. The light penetrates through the light guide 207 to reach the PMT 208, where the light is converted into electrons again. These electrons are cascade-multiplied. FIG. 18 is a graph showing SN-ratio deterioration factor in these signal detection processes. A symbol $F_1$ represents a noise factor in a process in which the tertiary electrons, which have been emitted from the target plate 205 by the incident secondary electrons, are converted into the light, and a symbol $F_2$ represents a noise factor in a process in which the light, generated in the scintillator 206, is converted into the electrons by the PMT 208. The SN ratio of an output is expressed by $$(S/N)_{out} = (S/N)_{in} \times (1/F_1) \times (1/F_2)$$

where $\delta_2$ represents a tertiary electron yield of the target plate 205, σ represents probability that the tertiary electrons reach the scintillator 206, Nq represents the number of photons emitted from the scintillator 206 by the secondary or tertiary electrons, and Pc represents probability that the photons reach the PMT 208 to cause the PMT 208 to emit photoelectrons and to successfully accomplish cascade amplification at a subsequent stage. In a case where the secondary electrons, which are signal sources, are detected directly by the scintillator, only $F_2$ is taken into account.

FIG. 19 is a graph showing the tertiary electron yield $\delta_2$ in the target-plate detection method. As shown in FIG. 19, when the energy of the secondary particles is as high as 10 KeV, the tertiary electron yield $\delta_2$ is reduced to about 0.5. As a result of the fact that $\delta_2$ is reduced to about 0.5 even if σ has a good value of near 1, the SN ratio is deteriorated in the conversion process because the SN ratio is multiplied by a $1/F_1$ factor which is about 0.5, as shown in a left graph of FIG. 18.

A right graph of FIG. 18 shows a noise factor in the process in which the light is converted into electrons. Since PcNq can have a value in a range of about 3 to 6, a value of $1/F_2$ is about 0.9, and as such, the deterioration of the SN ratio in this process is not so bad. In this manner, in the target method, the process of the tertiary electron emission from the target plate 205 is a bottleneck, which hinders the method from obtaining a good SN ratio.

The second disadvantage is that, since an initial energy of the tertiary electrons generated from the target plate 205 is as low as several eV, the tertiary electrons trace variously curved trajectories depending on differences in their generation point and their take-off angle besides azimuthal angle until they reach the scintillator 206, as shown in FIG. 17. According to simulation results, there is a time difference of about 20 ns at most in the transit time, as a result of a difference in length of the trajectories and the low speed of the tertiary electrons. When high-speed scanning is performed at 100 MHz, this width of the transit time is several times as long as a primary-beam dwelling time of 10 ns per pixel, thus causing an image blur in the scanning direction. For this reason, the target method is not suitable for the high-speed scanning.

The third disadvantage is that a high voltage of about 10 KV is applied to the scintillator 206 of this target type in order to draw or attract the low-speed tertiary electrons. The application of the high voltage generates an electric field, which is likely to cause a static beam deflection of the primary beam and it tends to fluctuate.

In order to solve the above-described problems, a scintillator arranged on the beam axis may be used, instead of using the above-described target plate 205 arranged on the beam axis. Direct detection by the scintillator is free from the above-described bottleneck and provides a detection system which is easy to attain a good SN ratio. The laid-open patent publication U.S. Pat. No. 8,895,935 is available as a prior patent document about an on-axis scintillator. The scintillator disclosed in this document is a detection system with a single-stage configuration. In order to enable the scintillator to be disposed on the beam axis, a metal tube for the passage of a primary beam is provided. However, no measure is taken for secondary particles escaping upstream through the metal tube. This document discloses another example wherein the secondary particles are deflected by an EXB (E cross B) so that the secondary particles are detected by a scintillator which is disposed away from the beam axis. In this case, it is necessary for the EXB to have a wide opening in order to deflect and detect all of the secondary particles which are spreading widely over a large area. This configuration entails a high voltage application and a large magnetomotive force. Namely, it is necessary to strongly excite the EXB in order to deflect a wide flux of all of the secondary particles out of the axis. As a result, the EXB has a strong influence on the primary beam accordingly. For these reasons, it is extremely difficult to capture all of the secondary particles with the single-stage scintillator in an SEM aimed at a large FOV.

Thus, there is proposed a detection system having scintillators of two-stage configuration. The two-stage scintillators are configured to detect widely-spreading secondary particles with an initial-stage on-axis scintillator, to deflect secondary particles that have passed through a central hole of the initial-stage on-axis scintillator with EXB (E cross B), and to detect the deflected secondary particles with a subsequent-stage scintillator. However, as the EXB affects the primary beam in a manner to increase a beam diameter, a certain measure for avoiding such an effect is indispensable for realizing a high-resolution SEM.

The above-described laid-open patent publications U.S. Pat. Nos. 7,462,828 and 8,153,969 disclose a measure for avoiding the adverse effect that the EXB has on the primary beam. According to these publications, two sets of EXBs are disposed on the axis, and are excited in mutually opposite polarities so as to cancel out energy dispersions and aberrations which are generated in these sets of EXBs. However, this arrangement is not practical because of disadvantageous conditions imposed this system, i.e., (a) two sets of EXBs are necessary, resulting in high costs, (b) due to limitations of their mutual axial precisions, it is difficult to conduct adjustment such that the primary beam travels straight, (c) the total length of the system becomes long because of the increased length of the optical path of the primary beam, and (d) the incident primary beam has to be parallel to the two sets of EXBs in order for them to cancel out the aberrations completely.

Another measure for avoiding the drawback is disclosed in the laid-open patent publication U.S. Pat. No. 6,455,848, which describes a method of reducing aberrations by focusing the primary beam to form a crossover in the center of EXB. However, this publication discloses nothing about a divergence angle of the crossover. Under a certain beam current condition, there is an optimum value for the divergence angle that minimizes the beam diameter on a specimen surface, and the optimum value depends on the beam current. Consequently, simply forming the crossover at the center of EXB is not sufficient for achieving an optimum condition for various beam current values, therefore the crossover has to be fixed in position and the divergence angle thereof also has to be controlled at an optimum value in accordance with the current value.

SUMMARY OF THE INVENTION

In one embodiment, there is provided scanning electron microscope comprising: a retarding power source configured to apply a retarding voltage, which is a negative voltage, to a specimen to reduce a landing energy of a primary beam; a combined objective lens configured to form an electric field and a magnetic field superimposed on one another and to focus the primary beam on a surface of the specimen; an electrostatic deflection system configured to deflect the primary beam, which has been narrowed by the combined objective lens, to direct the primary beam to each point in a field of view on the surface of the specimen; a first scintillation detector having a first scintillator configured to emit light upon incidence of secondary electrons which have been emitted from the specimen and accelerated in an axial direction of the primary beam by the retarding voltage and have passed through the combined objective lens, the first scintillator being grounded and arranged on an axis of the primary beam, the first scintillation detector having a passage hole for allowing the primary beam to pass therethrough; a Wien filter arranged upstream of the first scintillator and configured to deflect the secondary electrons, which have passed through the passage hole, in one direction without deflecting the primary beam; and a second scintillation detector having a second scintillator configured to detect the secondary electrons deflected by the Wien filter, the second scintillator being grounded and having a distal end located away from the axis of the primary beam.

In one embodiment, the distal end of the second scintillator is located away from the axis of the primary beam by a distance ranging from 0.5 mm to 2 mm.

In one embodiment, the first scintillation detector further includes a first photo-multiplier tube configured to convert the light into electrons, a first light guide configured to transmit the light, emitted in the first scintillator, to the first photo-multiplier tube, and a first amplifier configured to amplify an output signal of the first photo-multiplier tube. The second scintillation detector further includes a second photo-multiplier tube configured to convert light into electrons, a second light guide configured to transmit the light, emitted in the second scintillator, to the second photo-multiplier tube, and a second amplifier configured to amplify an output signal of the second photo-multiplier tube. A decay time of each of the first and second scintillators is not more than 2 nanoseconds, a width of a light-transit time in each of the first and second light guides is not more than 1 nanosecond, and widths of rise and fall times of a pulse of each of the first and second photo-multiplier tubes are not more than 1 nanosecond, and a bandwidth of each of the first and second amplifiers is at least 150 MHz.

In one embodiment, the scanning electron microscope further comprises: an adder circuit configured to add an output signal of the first scintillation detector and an output signal of the second scintillation detector; and a delay circuit disposed between the first scintillation detector and the adder circuit, the delay circuit being configured to delay the output signal of the first scintillation detector such that the output signal of the first scintillation detector and the output signal of the second scintillation detector arrive at the adder circuit simultaneously.

In one embodiment, the passage hole is in a shape of an inverted frustum of a cone having a slope angle ranging from 1 degree to 2 degrees.

In one embodiment, the scanning electron microscope further comprises a condenser lens system configured to form a crossover of the primary beam at a center of the Wien filter, so that energy dispersion and second-order aberrations of the primary beam, which are generated at the Wien filter, can be suppressed and an optimal value of a divergence angle of the crossover for obtaining a minimum beam diameter can be established.

In one embodiment, the condenser lens system includes at least three condenser lenses which are configured to be able to simultaneously satisfy three conditions, which are to allow a beam current to vary in a range of 10 pA to 100 nA, to optimize a divergence angle of the primary beam entering the combined objective lens for each beam current, and to form the crossover at the center of the Wien filter at all times.

In one embodiment, the scanning electron microscope further comprises a third detector configured to detect secondary particles emitted from the specimen, wherein the third detector is disposed at an opposite side of the axis of the primary beam from the second scintillation detector, and wherein the Wien filter is configured to reverse vectors of an electric field and a magnetic field simultaneously to switch a deflection direction of the secondary particles between a first direction toward the second scintillation detector and a second direction toward the third detector.

In one embodiment, the Wien filter is configured to be able to deflect the secondary particles to the second scintillation detector at a deflection angle of not more than 10 degrees and to deflect the secondary particles to the third detector at a deflection angle of at least 20 degrees.

In one embodiment, the Wien filter has electrodes and magnetic poles which are formed by permalloy.

In one embodiment, the Wien filter has boundary-limiting plates secured to an upper surface and a lower surface of the Wien filter, the boundary-limiting plates being formed by permalloy.

In one embodiment, an effective detection energy range, which is determined by a thickness of the second scintillator, is from 6 keV to 12 keV, and wherein the third detector comprises a semiconductor detector or scintillation detector capable of detecting secondary particles having energy in a range of 10 keV to 50 keV.

In one embodiment, the scanning electron microscope further comprises an energy analyzer arranged between the third detector and the Wien filter, wherein the Wien filter and the analyzer are configured to form a deflection field and a sector field, respectively, constituting a tandem deflection field, the passage hole of the first scintillation detector serves as a virtual light source, the third detector is located at an image forming plane of the tandem deflection field, and the third detector has a multichannel detector configured to separate charged particles in accordance with energy band and to detect the separated charged particles simultaneously.

In one embodiment, the energy analyzer has an inner spherical electrode and an outer spherical electrode which are formed by a material composed mainly of an element having low atomic number.

In one embodiment, the energy analyzer is configured to measure an amount of energy loss of back scattered electrons to thereby determine a depth at which the back scattered electrons have been generated in the specimen.

In one embodiment, the scanning electron microscope is able to display depth resolved scanning images.

In one embodiment, the scanning electron microscope further comprises: a field control plate arranged below the combined objective lens; and a FCP control power source coupled to the field control plate and the retarding power source.

According to the above-described embodiments, the following effects can be obtained.

With the upper and lower scintillators which are grounded and the Wien filter (i.e., a beam separator of EXB), the scanning electron microscope: (1) can detect secondary electrons, which have been accelerated to 6 keV to 15 keV by the retarding potential, at a high-speed pixel rate of 100 MHz or higher without causing a blur between pixels; (2) can detect almost all of the secondary electrons emitted from the specimen surface without a detection loss; and (3) can eliminate adverse influences, such as chromatic aberrations and other aberrations caused by the EXB, improper deflections, distortions, and ripples which would occur if a high voltage is applied to the scintillators. These merits make it possible for the first time to inspect semiconductors while satisfying all the requirements including low damage, a high resolution, a high beam current, a high-speed scanning (high throughput), and a large field of view.

Furthermore, by selecting the detectors having different characteristics and by changing acceleration voltages, it is possible for a single apparatus to operate for various applications in different fields, such as an inspection of defects on the order of nanometer with a high resolution of secondary electrons and high-speed and high-sensitive observation under a low landing energy, or an observation of back-scattered electrons under a high landing energy at 40 to 50 KeV, performed together with a secondary electron observation, and an analysis of phenomena that occur in deep layers, such as for an observation of an overlay and a bottom of a deep hole. For BSE observations, a new function of selecting BSE whose depth of its generation is specified by an energy analyzer, is added. So, new applications using this function are also expected.

DESCRIPTION OF EMBODIMENTS

Figure 1:
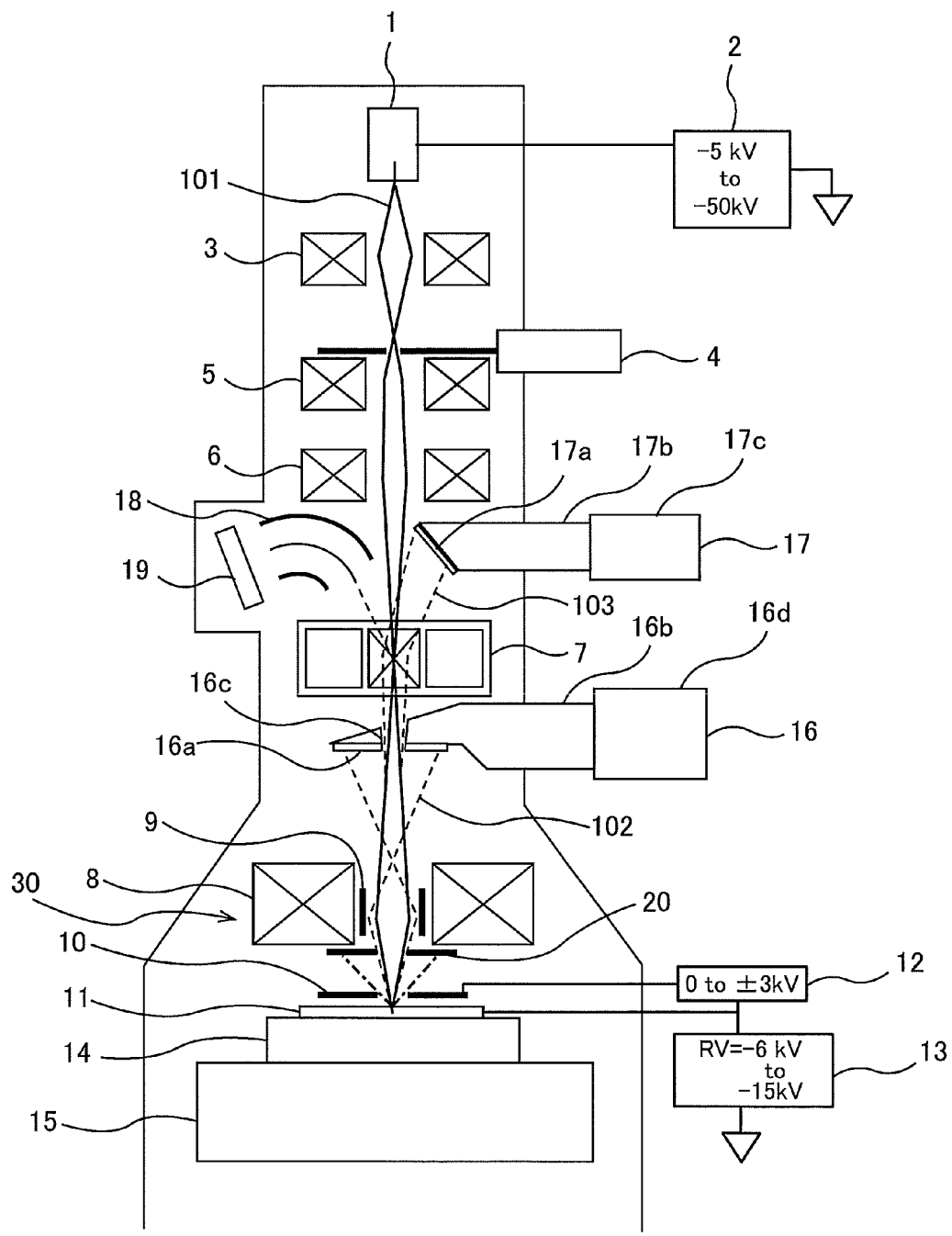
FIG. 1 is a diagram showing a whole structure of an embodiment of a scanning electron microscope (SEM) according to the present invention.

FIG. 1 is a diagram showing a whole structure of an embodiment of a scanning electron microscope (SEM) according to the present invention. As shown in FIG. 1, the scanning electron microscope includes an electron gun 1 for emitting a primary beam (or an electron beam) 101, an acceleration power source 2 for accelerating the primary beam, three condenser lenses 3, 5, 6 for converging the primary beam, a current restriction aperture 4 for restricting a beam current, a retarding power source 13 for applying a retarding voltage, which is a negative voltage, to a specimen 11 to reduce a landing energy of the primary beam, and a combined objective lens 30 for focusing the primary beam on a surface of the specimen 11.

The electron gun 1 is a TFE electron gun. The acceleration power source 2 is coupled to the electron gun 1 so that the acceleration power source 2 can apply an acceleration voltage to the electron gun 1 so as to accelerate the primary beam. The specimen 11, such as a wafer, is placed on a specimen table 14 that can withstand a high voltage. The specimen table 14 is configured to be able to move in a horizontal plane by an XY stage 15. The combined objective lens 30 includes an objective (magnetic field) lens 8. A low-angle back-scattered electron detector (LA-BSED) 20 is secured to a lower portion of the objective lens 8. This low-angle back-scattered electron detector 20 is grounded to have a ground potential. An electrostatic deceleration field is formed between the specimen 11 and the low-angle back-scattered electron detector 20. This electrostatic deceleration field exerts a lens action on the primary beam. The electrostatic deceleration field and the objective lens 8 constitute the combined objective lens 30.

The scanning electron microscope further includes an electrostatic deflection system 9 for deflecting the primary beam that has been focused by the combined objective lens 30 and directing the primary beam to each of points in a field of view on the surface of the specimen 11. This electrostatic deflection system 9 may be an electrostatic octapole deflection system. The primary beam is deflected by the electrostatic deflection system 9 so as to scan the specimen 11 over a wide field of view.

The scanning electron microscope further includes a first scintillation detector 16 having a first scintillator 16a located on an axis of the primary beam, and a second scintillation detector 17 having a second scintillator 17a located above the first scintillator 16a. The first scintillator 16a and the second scintillator 17a are grounded to have a ground potential. Secondary electrons, which have been emitted from the specimen 11 in various directions at various angles, are accelerated in the axial direction of the primary beam by the retarding potential, while converging toward the beam axis once by the action of the combined objective lens 30. Further, the secondary electrons, having the energy accelerated by the retarding potential, collide the first scintillator 16a, thereby causing the first scintillator 16a to emit light.

The first scintillation detector 16 has a passage hole 16c for allowing the primary beam to pass therethrough. The secondary electrons, which enter this hole surface, pass through the passage hole 16c in a direction opposite to the primary beam, and as a result, the secondary electrons are formed into a thin flux. These secondary electrons are deflected in one direction by the Wien filter 7 that is arranged upstream of (or above) the first scintillator 16a. This Wien filter 7 is configured to be able to deflect the secondary electrons in one direction, while permitting the primary beam to travel straight. The secondary electrons, which have been deflected in one direction by the weak excitation of the Wien filter 7, are detected by the second scintillator 17a. The first scintillator 16a is disposed on the axis of the primary beam, while the second scintillator 17a is located away from the axis of the primary beam. In one embodiment, the distal end of the second scintillator 17a is located away from the axis of the primary beam by a distance in a range of 0.5 mm to 2 mm (e.g., about 1 mm).

The main factor that hinders a higher resolution with a low landing energy is a coulomb interaction. The spreading of the beam in a direction perpendicular to the beam axis due to the coulomb interaction can be suppressed to a relatively small level by increasing the acceleration voltage. Thus, it is effective to set the acceleration voltage to 15 kV or higher, and to apply a deceleration potential (or retarding potential) of 15 kV or lower to the specimen 11 (e.g., a wafer), therefore to lower the landing energy down to 0.1 KeV to 5 KeV immediately before the primary beam falls on the specimen 11. The primary beam becomes resistant to disturbances because the high acceleration energy lowers the sensitivity to electromagnetic field noise. These approaches make it possible to achieve a large current and a high resolution under the condition of a low landing energy.

When the primary beam impinges on the specimen 11 while scanning the specimen 11, secondary particles, such as secondary electrons and back-scattered electrons, are emitted from the specimen 11. At this time, the deceleration field acting on the primary beam acts as an acceleration field on the secondary particles. This acceleration effect in the beam axial (Z-axis) direction causes the secondary electrons, which have small initial energy, to have almost only a velocity component in the beam axial direction. Accordingly, the secondary electrons pass through the center of the objective lens 8 while helically moving in the magnetic field of the objective lens 8, and almost all of the secondary electrons travel back upstream on the beam axis. Therefore, the detection method for the secondary electrons must be a Through-The-Lens method in which a detector is disposed upstream of an objective lens.

In this manner, the high-energy secondary electrons, which have been accelerated by the retarding voltage, pass through the objective lens 8, and then converge once. Thereafter, the secondary electrons start to diverge and spread with their travel distance. The first scintillation detector 16 is provided as a detection system capable of detecting all of these secondary electrons at a high speed. The first scintillation detector 16 is arranged upstream of the objective lens 8 and is located on the beam axis. The first scintillation detector 16 is disposed at a position which is not far away from the objective lens 8, and detects the secondary electrons that have been distributed diverging in a plane perpendicular to the beam axis.

The first scintillation detector 16 has a first light guide 16b located on the beam axis. The second scintillation detector 17 has a second light guide 17b located away from the beam axis. The above-described passage hole 16c for the passage of the primary beam is formed in the first light guide 16b and the first scintillator 16a. The secondary particles (i.e., the secondary electrons and the back-scattered electrons) that have passed through the passage hole 16c are formed into a thin flux beam which has a diameter corresponding to the diameter of the passage hole 16c. The Wien filter 7 forms therein a superimposed field of EXB (E cross B) where an electric field and a magnetic field intersect orthogonally. The EXB deflects the secondary particles, which have passed through the passage hole 16c upwardly, in one direction, while permitting the primary beam to move straight. The secondary particles that have been deflected by the EXB are detected by the second scintillation detector 17 which is disposed upstream of the EXB and located away from the beam axis. This second scintillation detector 17 has the same high-response-speed characteristic as the first scintillation detector 16. Since the Wien filter 7 slightly deflects the thin flux of the secondary particles, it can easily be fabricated and adjusted. Almost all of the secondary electrons emitted from the specimen 11 can thus be captured.

Since the first scintillator 16a is disposed on the axis of the primary beam and the second scintillator 17a is disposed near the primary beam, these scintillators 16a, 17a are required to have such a structure that does not interfere the primary beam at all through potential differences. This can be realized by coating the scintillators 16a, 17a, inner walls of the passage hole 16c, and the light guides 16b, 17b with metal, and by keeping the scintillators 16a, 17a and the light guides 16b, 17b at the ground potential. The energy for the secondary particles that cause the scintillators 16a, 17a to emit light is all given by the acceleration energy generated by the retarding potential. In order to detect the secondary electrons on the basis of this need, an additional condition is added such that the retarding potential is required to be at least −6 KV. There is no technical problem in satisfying this condition.

In order to reduce chromatic aberrations and other second-order aberrations that the Wien filter 7 imposes on the primary beam, a crossover of the primary beam is formed at the center of the EXB, with a divergence angle of the crossover controlled. As a result, the aberrations that occur upstream and downstream of the crossover are cancelled mutually to become zero, and an optimum resolution is maintained.

Because of the above requirement, a new condition is added which has not been present in a conventional condenser lens system. The conventional condenser lens system has two functions, i.e., a function to set a current variably in a wide range and a function to set optimum aperture angles of the objective lens which are inherent in respective current values. In addition to these functions, a new condition of fixing the crossover at the center of the EXB at all times is imposed. In order to meet this requirement, in this embodiment, the condenser lens system comprises the three condenser lenses 3, 5, 6 having respective lens strength which have been set independently, thereby simultaneously satisfying the above three conditions.

For observing a layer at a depth of about 10 μm using the back-scattered electrons, the primary beam is required to penetrate deeply into the specimen 11 and to have a high landing energy of about 40 KeV. Although the retarding potential is not required to decelerate the primary beam, it is necessary to apply a voltage of −10 KV for mainly accelerating the secondary electrons. Therefore, the acceleration voltage up to 50 KV is required.

Some of the back-scattered electrons have initial energy close to the landing energy. The energy of the retarding potential is added to the initial energy in the acceleration field, thereby causing the back-scattered electrons to have the same energy as the acceleration voltage at maximum. The back-scattered electrons, whose emission angle with respect to a direction normal to the surface of the specimen 11 is smaller than about 10° (i.e., high-angle back-scattered electrons (or high angle BSE) with a take-off angle of 80° with respect to the surface of the specimen 11), travel in the axial direction in the same manner as the secondary electrons, because their component of the momentum in a direction perpendicular to the beam axis is small, and these back-scattered electrons are detected by the through-the-lens detector.

The back-scattered electrons, whose take-off angle is smaller than 80° (a low emission angle with respect to the surface of the specimen 11: low-angle BSE), have a large velocity component also in a direction perpendicular to the beam axis. Therefore, these back-scattered electrons are relatively less likely to be affected by the acceleration field and the magnetic field of the objective lens 8, and travel while largely spreading from the beam axis. These back-scattered electrons are detected by the axisymmetric low-angle back-scattered electron detector 20 having an opening in its center. The low-angle back-scattered electron detector 20 is attached to a lower pole of the objective lens 8.

For the reasons described later, it is inefficient to detect the back-scattered electrons having high energy which travel on the beam axis with the first and second scintillators 16a, 17a. Thus, such high-energy back-scattered electrons that have been emitted at high take-off angles are detected by a dedicated third detector 19. This third detector 19 is disposed at an opposite side of the beam axis from the second scintillation detector 17. The Wien filter 7 has a function to switch the polarities of electrodes and magnetic poles of the EXB. By reversing vectors of the electric field E and the magnetic field B simultaneously, the primary beam is allowed to travel straight as it is, while the deflection direction of the secondary particles can be changed by 180°. Therefore, it is possible to select and set in advance either the second scintillation detector 17 or the third detector 19 to be used to detect the secondary particles that have passed through the Wien filter 7.

The back-scattered electrons that have been reflected at high emission angle are reflected off by a relatively shallow layer below the surface of the specimen 11. Since the amount of energy loss of the high-angle back-scattered electrons is approximately proportional to the depth of the layer at which the back-scattered electrons have been generated in the specimen 11. Therefore, the generation depth of the back-scattered electrons can be specified by determining the amount of energy loss of the back-scattered electrons using an energy analyzer.

It is possible to display a secondary electron image and a high angle BSE image separately distinguished by its energy. The BSE image has compositional information of shallow surface layers, and the secondary electron image has topographic information of the surface.

Thus, in order to separate the energy of secondary particles, an energy analyzer for generating a sector-shaped electrostatic field is disposed between the Wien filter 7 and the third detector 19. The passage hole 16c of the first scintillation detector 16, which is located on the beam axis, is regarded as a virtual light source. The secondary particles, which have been narrowed by the passage hole 16c, pass through a deflection field of the EXB at an initial stage and a sector-shaped electric field at a subsequent stage in this order. The deflection field and the sector-shaped electrostatic field constitute a tandem deflection field, which makes energy dispersions of both fields into an additive type to thereby cause large energy dispersion. The third detector 19 comprises multichannel back-scattered electron detectors which are arrayed in a position where an image of the virtual light source is formed. The third detector 19 is configured to detect the secondary particles independently and simultaneously in accordance with sorted energies.

The above-discussed detection system makes it possible to select the high-speed detection of secondary electrons or the detection of the energy-sorted back-scattered electrons.

The overview of the present invention has been described above. Embodiments will be described in specific detail below.

The primary electron flux 101 is emitted from the electron gun 1. The acceleration voltage of a desired value in a rage of 15 KV to 50 KV, depending on an application, is applied to the electron gun 1 by the acceleration power supply source 2. For example, an acceleration voltage of 15 KV is applied for the purpose of a low landing energy and a high resolution, while an acceleration voltage of 50 KV is applied for the purpose of the observation of a deep layer. The first condenser lens 3 forms a first crossover in front of the current restriction aperture 4. By controlling the position of this crossover, a beam current can be changed in a range of 0.1 nA to 100 nA. The primary beam, whose beam current has been limited to a desired value, e.g., 10 nA, travels straight while forming a second crossover in the center of the Wien filter 7, and passes through the passage hole 16c of the first scintillation detector 16. Further, the primary beam is focused on the surface of the specimen 11 by the objective lens 8.

Figure 5:
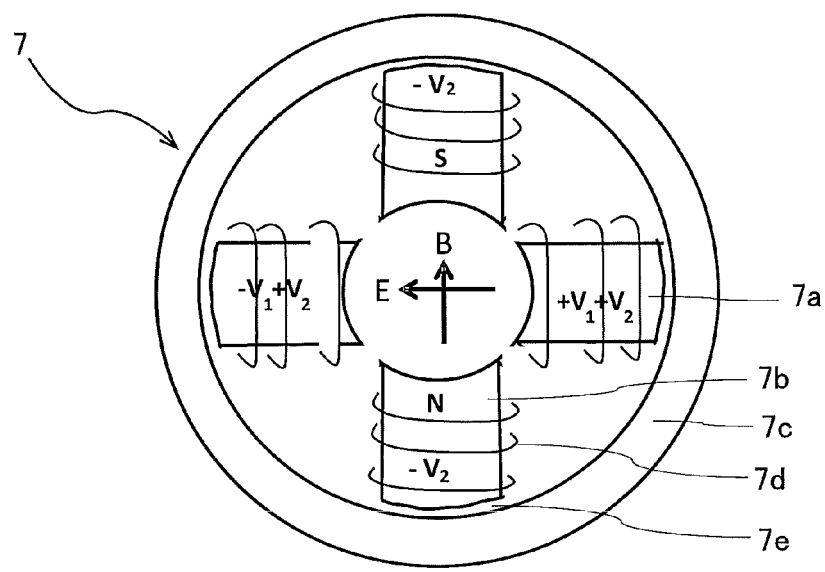
FIG. 5 is a diagram showing a relationship between a cross-sectional structure of the Wien filter and voltage applied for deflecting negatively-charged secondary particles rightward.
Figure 6:
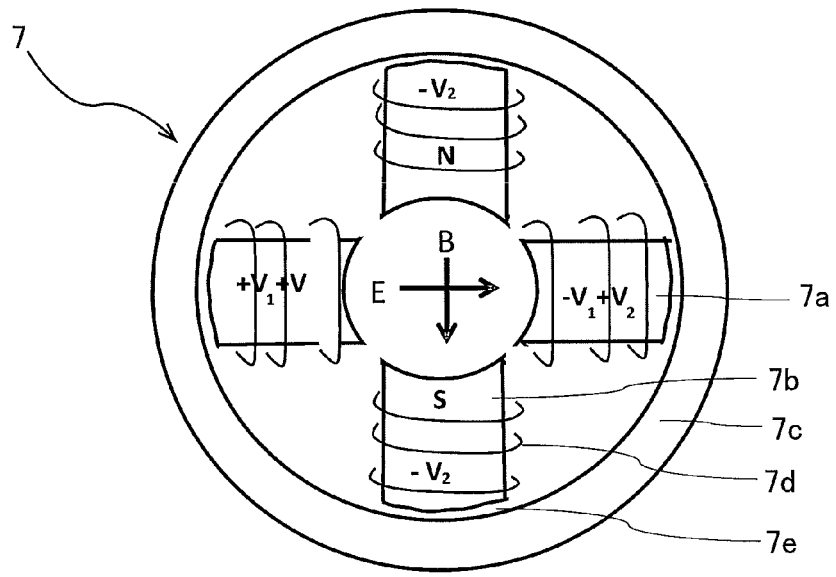
FIG. 6 is a diagram showing a relationship between a cross-sectional structure of the Wien filter and voltage applied for deflecting negatively-charged secondary particles leftward.

As shown in FIG. 5, the Wien filter 7 is arranged such that a uniform electrostatic field E generated by electrodes 7a and a uniform magnetostatic field B generated by magnetic poles 7b intersect orthogonally. Strength of the electrostatic field E and the magnetostatic field B are adjusted such that directions of forces that the electric field E and the magnetic field B exert on the primary beam 101 passing therethrough are opposite to each other to cancel out those forces. The relationship between the electric field E and the magnetic field B is referred to as a Wien condition, which is expressed by the following equation.

$$E = (2\eta \Phi_0)^{1/2} B$$

$\eta \equiv e/m$: specific charge of electrons, $\Phi_0$: energy of primary electrons When the Wien condition is satisfied, the primary beam is not deflected, and travels straight. The secondary particles 103, which travel in a direction opposite to the primary beam, receive a force from the electric field in the same direction as the direction of the force that the primary beam receives from the electric field, while the secondary particles 103 receive a force from the magnetic field in a direction opposite to the primary beam because the velocity vector is in the opposite direction. Therefore, the directions in which the forces act are the same in the electric field and the magnetic field, and the secondary particles which have negative charges are deflected toward the direction of the positive electrode. An amount of the deflection of the secondary particles 103 can be adjusted by simultaneously changing the strength of both the electric field and the magnetic field while maintaining a strength ratio E/B constant which is a condition for allowing the primary beam to travel straight. However, if the acceleration voltage is changed, it is necessary to change the strength ratio E/B for allowing the primary beam to travel straight.

Wien filters having 4 poles, 8 poles, or 12 poles are known. The structures of 8 poles and 12 poles have an advantage of being able to eliminate second-order aberrations, while they tend to be complex in terms of structure and adjustment. In this embodiment, the 4-pole structure, which is structurally the simplest, is employed because the EXB can be weakly excited in use and aberrations can be eliminated by a method described later.

As shown in FIG. 5, inner end surfaces of the electrodes 7a and the magnetic poles 7b, facing toward the beam, have an axisymmetric shape with respect to a central axis, e.g., a rectangular shape or a circular shape. Coils 7d are wound around the magnetic poles 7b. Voltages shown in FIG. 5 are applied to the electrodes 7a and the magnetic poles 7b. V1 represents a high voltage for deflecting the secondary particles, and V2 represents a low voltage for stigmatic focusing. In this embodiment, the Wien filter 7 has an inside diameter of 14 mm, and the electrodes 7a and the magnetic poles 7b have a thickness of 20 mm. For deflecting the secondary electrons (SE) of 10 KeV by 10°, the voltage V1 of ±700 V and a magnetomotive force of 15 AT are necessary, and the voltage V2 is about ±4 V. A return yoke 7c for a magnetic circuit in a ring shape, which is grounded to have a ground potential, is disposed outside the electrodes 7a and the magnetic poles 7b. The electrodes 7a and the magnetic poles 7b are magnetically coupled to the return yoke 7c, while they have to be electrically insulated for withstanding a high voltage. A reference numeral 7e represents an electromagnetic pole insulation gap.

Figure 2:
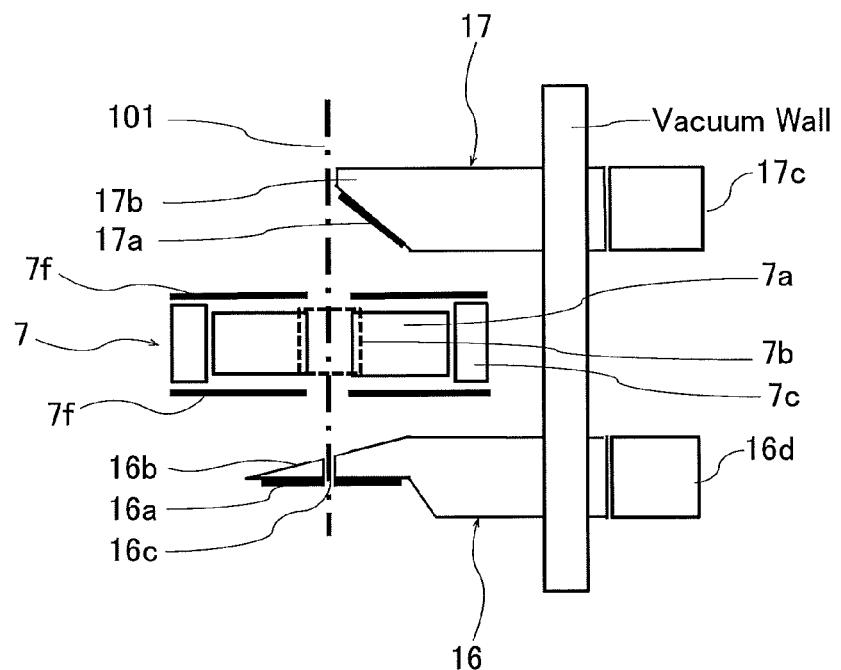
FIG. 2 is a diagram showing an arrangement of a first scintillation detector, a second scintillation detector, and a Wien filter.

As shown in FIG. 2, boundary-limiting plates 7f are installed above and below the electrodes 7a and the magnetic poles 7b, respectively, for sharply cutting the fields so that the distribution of the fields does not expand distantly. The boundary-limiting plate 7f is often called Herzog end plate.

In one embodiment, the boundary-limiting plates 7f are secured to an upper surface and a lower surface of the Wien filter 7. The electrodes 7a, the magnetic poles 7b, and the boundary-limiting plates (Herzog end plates) 7f are formed by permalloy having low magnetic hysteresis so that an axial shift of the primary beam does not occur even when the vectors of the electric field and the magnetic field are reversed simultaneously.

The primary beam 101 is narrowed by the combined objective lens 30 and is focused on the specimen 11. Simultaneously, the primary beam 101 is deflected by the electrostatic deflection system (or scanning deflection system) 9, to do raster-scanning on the specimen 11 at a high-speed pixel rate of 100 MHz while maintaining a perpendicular incidence on the surface. The electrostatic deflection system 9 includes electrostatic octapole arranged in the field of the objective lens 8.

The retarding voltage is applied to the specimen 11 by the retarding power source 13. The low-angle back-scattered electron detector (LA-BSED) 20 is attached to a lower surface of a yoke that forms the lower pole of the objective magnetic field lens 8. The low-angle back-scattered electron detector 20 is grounded to have a ground potential. An electrostatic deceleration field is formed between the specimen 11 and the low-angle back-scattered electron detector 20. This electrostatic deceleration field serves as an electrostatic lens that has a lens action on the primary beam. The combination of the electrostatic deceleration field and the objective magnetic field lens 8 constitutes the combined objective lens 30. In a case of no low-angle back-scattered electron detector 20, the lower pole yoke of the objective magnetic field lens 8 serves as a ground-side electrode of the electrostatic lens. The primary beam 101 is focused on the specimen 11 by the combined objective lens 30. At the same time, the primary beam 101 is decelerated by the retarding potential immediately before it reaches the specimen 11, so that the primary beam 101 collides the specimen 11 at a low landing energy. With the retarding lens system thus arranged, the primary beam 101 can travel in a long optical path from the first anode of the light source to the objective lens 8, with a high energy which is the same as the acceleration voltage. As a result, lateral spreading of the beam due to the coulomb interaction and disturbances owing to an electromagnetic disturbing field can be minimized, and a high resolution can be achieved. At the same time, the landing energy can be lowered, thus reducing damage to semiconductor devices.

Since an increase $\Delta V_r$ in the lateral velocity component generated by the coulomb interaction and a lateral fluctuation width of the beam due to the disturbance field become small relative to an axial velocity component $V_z$ as the acceleration voltage increases. Accordingly, the spreading of the electron flux is reduced approximately in inverse proportion to the acceleration voltage. With a conventional acceleration voltage of 5 KV, the spreading of the beam due to the coulomb interaction is several times as much as the spreading of the beam due to geometric aberration. As a result, a theoretical high resolution cannot be obtained. Thus, when the acceleration voltage is set to 15 V which is five times the conventional acceleration voltage, the coulomb interaction decreases to about one-fifth, which is smaller than the geometric aberration, under the same beam current condition. As a result, a theoretical high resolution can be obtained. How much the acceleration voltage is to be increased to achieve the purpose depends on the beam current, while the strength of the electrostatic deceleration lens portion of the combined objective lens 30 is also a limiting factor. If the acceleration voltage is increased too high accompanied with the retarding voltage, the action of the electrostatic deceleration lens portion becomes too strong. As a result, even if the objective magnetic field lens 8 is turned off, the crossover is formed in front of the specimen 11 only by the electrostatic deceleration lens portion, thus failing to control the focusing on the surface of the specimen 11. Therefore, in a low landing energy mode, the acceleration voltage of about 15 KV is appropriate so that the retarding voltage does not exceed 15 KV.

The above-described retarding potential acts as an acceleration potential for the negatively-charged secondary particles (including the secondary electrons and the back-scattered electrons) which have been emitted from the specimen 11. The acceleration energy due to the retarding potential is added to the initial energy that the secondary particles have had upon emission. For example, if the acceleration voltage is 15 KV and the retarding potential (negative voltage) is 13 KV, then the landing energy is 2 KeV, whereas the secondary electrons have an energy of 13 KeV.

The initial energy of the secondary electrons is small, and their momentum in radial directions (directions perpendicular to the beam axis) is almost zero. The secondary electrons have only an energy accelerated in the direction of the beam axis, no matter what emission angles they have been emitted at. Therefore, all of the trajectories of the secondary electrons are trapped by the lens magnetic field and converge in a small range in the vicinity of the axis. Further, the secondary electrons are subjected to the action of the combined objective lens 30 to converge once, and then diverge while travelling backward in a direction opposite to the primary beam. Consequently, the detectors for the secondary electrons have to be disposed on the beam axis upstream of the objective lens 8 (through-the-lens system).

Figure 14:
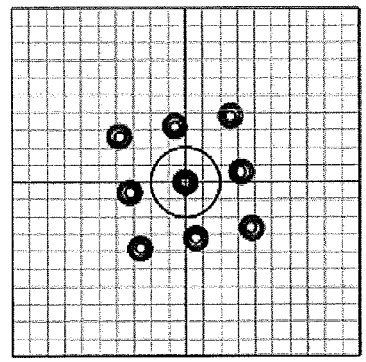
FIG. 14 is a diagram showing a simulation result for trajectory distribution of 50 keV BSE spreading on a first scintillator surface.
Figure 15:
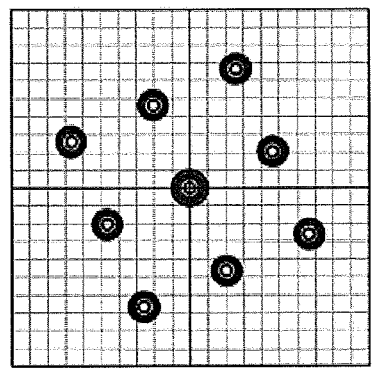
FIG. 15 is a diagram showing a trajectory simulation of secondary electrons having energy of 10 KV under the same conditions as FIG. 14.
Figure 16:
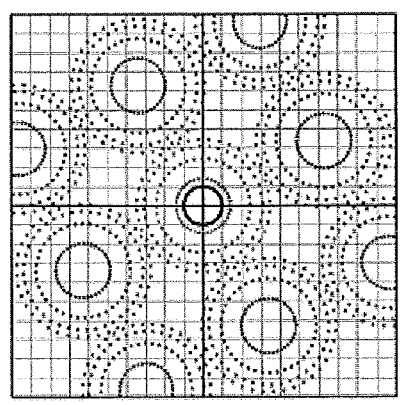
FIG. 16 is a diagram showing a trajectory simulation of secondary electrons with an FCP offset voltage adjusted under the same conditions as FIG. 14 and FIG. 15.
Figure 17:
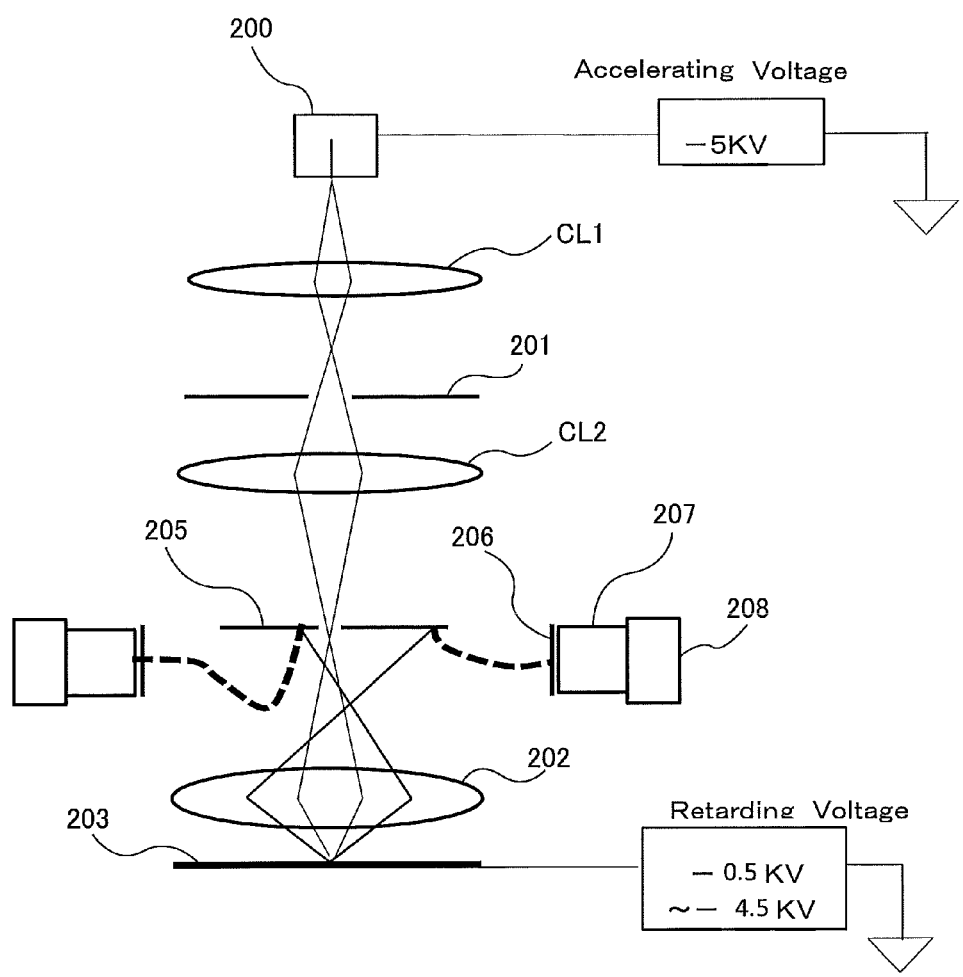
FIG. 17 is a schematic view showing a conventional target detection method.

The trajectories of the above-described secondary electrons are subjected to a rotating action due to the magnetic field formed by the objective lens 8 and the deflecting action due to the electric field formed by the scanning deflection system 9, in addition to the acceleration field formed by the retarding potential. As a result, the trajectories 102 of the secondary electrons on a detection plane of the first scintillator 16a spread several tens of times as large as the scanning area (FOV) of the primary beam. A distribution width expands in the radial direction, and a defocus divergence becomes greater with a distance from the convergence point. The extent of the divergence is affected by the strength of the combined objective lens 30 that is sensed by the secondary particles, and depends on the energy of the secondary particles. The landing energy may be varied in a range of several hundred eV to 10 KeV depending on an application. The landing energy can be varied by changing the retarding potential. Therefore, the energy of the secondary electrons is also greatly varied, resulting in a large change in the strength of the lens action affected by the combined objective lens 30. The converging action on the secondary electrons is thus greatly changed, so that the width of trajectory divergence at the position of the first scintillator 16a varies from a relatively small width of several millimeters to a width of 20 mm or more. FIGS. 14 through 16 show examples of the trajectory distribution of the secondary particles on the detection plane of the first scintillator 16a.

In order to detect, at a high response speed, the secondary electrons 102 that are distributed widely around the beam axis depending on a width of FOV, the first scintillation detector 16 is disposed on the beam axis at a position upstream of the objective lens 8. This first scintillation detector 16 has the detection plane which is perpendicular to the beam axis. The first light guide 16b is disposed cohered to the first scintillator 16a located on the beam axis. This light guide 16b has a wide detection area, and has a reflecting surface of light which is required to have a taper angle of at least several tens of degrees because it should have large effective range as much as possible for total reflection of light. Therefore, the passage hole 16c has a length of at least several millimeters. The passage hole 16c, which is formed in the first scintillator 16a and the first light guide 16b for allowing the primary beam to pass therethrough, is required to have an inside diameter large enough not to interfere with the spreading primary beam flux 101. Further, in order to avoid adverse effects that can occur when the wall surface of the passage hole 16c is charged up by accumulated contaminants, the passage hole 16c is required to have the inside diameter of at least 1 mm. The inside diameter of the passage hole 16c may desirably be about 2 mm in view of the ease with which to adjust the axis of the primary beam, the safety for long-term stability, and the mechanical axial precision of assembling parts. The passage hole 16c of this size allows a considerable percentage of the secondary electrons 103 that have converged near of the axis to escape. If a scan image is created only with the first scintillation detector 16, such a scan image contains a dark area surrounding the center of the field of view (FOV).

Thus, in order to detect the secondary particles 103 that have passed through the passage hole 16c of the first scintillation detector 16 and have been shaped into a narrow beam, the second scintillation detector 17 is disposed upstream of (or above) the first scintillation detector 16. The Wien filter 7 is located between the first scintillation detector 16 and the second scintillation detector 17. The secondary particles 103 that have passed through the passage hole 16c are deflected by the Wien filter 7 at a deflection angle of about 10° or less, and are detected by the second scintillation detector 17, which is configured to be able to detect them at a high speed, as well as the first scintillation detector 16. The second scintillation detector 17 is also grounded to have the ground potential. The deflection angle of the secondary particles 103 directed toward the second scintillator 17a is preferably in a range of 5° to 10°.

The Wien filter 7 is used with the deflection angle of up to 10° because the Wien filter 7 is weakly excited so as to minimize the effect on the primary beam, as described later. Since the second scintillator 17a is located off the beam axis, the second scintillator 17a does not need to have a passage hole. The second light guide 17b has a surface inclined with respect to the beam axis, and the second scintillator 17a is fixed to this inclined surface of the second light guide 17b. As an angle of inclination of the second scintillator 17a with respect to the central axis of the second light guide 17b becomes closer to 90°, an effective angle range for total reflection in the second light guide 17b becomes greater, and therefore a light transmission rate increases. On the other hand, an incident angle of the secondary particles becomes very low, and therefore a large reflection occurs on the surface. Further, if the angle of inclination of the second scintillator 17a is large, a tolerance for a change in the EXB deflection angle, which occurs when the energy of the secondary particles is varied, is lowered. In view of a balance of these factors, the angle of inclination of the second scintillator 17a with respect to the central axis of the second light guide 17b is preferably around 45°.

The lights, emitted from the first and second scintillators 16a, 17a, are reflected totally or specularly in the first and second light guides 16b, 17b, respectively, and are directed, with minimum transmission loss, into the first and second photo-multiplier tubes (PMTs) 16d, 17c, which are installed outside a vacuum. These PMTs 16d, 17c convert the lights into electrons, which are then cascade-amplified and outputted. Since information is transmitted in the form of light between the scintillators 16a, 17a and the PMTs 16d, 17c, a transmission speed is very high, and a transmission time is not more than 1 ns. Because a transmission time width due to a difference in path is as small as 1 ns or less, the optical transmission is suitable for high-speed scanning. This high-speed optical transmission can solve problems of pixel interactions or blur upon high-speed scanning which are generated at a transit time width, which may be of up to 20 ns, of the tertiary electrons that are unavoidable in the target detection system. In the technique of the present invention, limiting factors of the response speed include a decay time of the scintillators 16a, 17a and pulse amplification response characteristics of the PMTs 16d, 17c. In one embodiment, the decay time of the high-speed scintillators 16a, 17a is not more than 2 ns, a width of a light-transit time of the light guides 16b, 17b is not more than 1 ns, and widths of rise and fall times of a pulse of the PMTs 16d, 17c is about 1 ns or less.

A first amplifier 16e and a second amplifier 17d are coupled to output sides of the PMTs 16d, 17c, respectively. High-speed amplifiers, each having a bandwidth of 150 MHz or 300 MHz, are available for the first amplifier 16e and the second amplifier 17d.

In these high-speed amplifiers, the larger the bandwidth is, the smaller a conversion factor from an input current into an output voltage becomes. Therefore, it is inadvisable to select a bandwidth which is larger than necessary. In a case of using an amplifier having a bandwidth of 150 MHz, a rise time RT of this amplifier is about 2.3 ns. It is known that a response characteristic or bandwidth BW of an output signal through amplification of an input signal is given by $$BW(\text{GHz}) = 0.35/RT(\text{ns})$$

Figure 18:
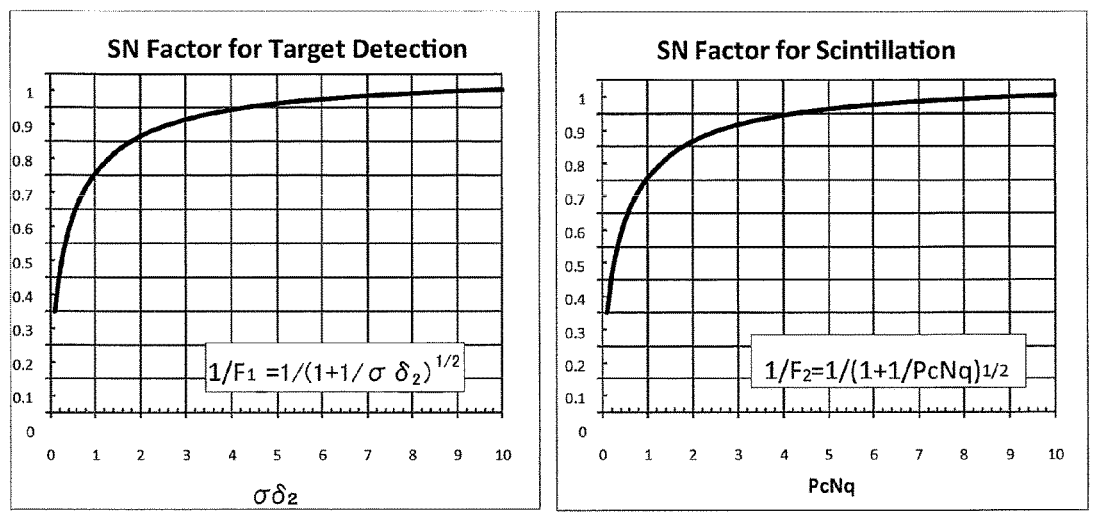
FIG. 18 is a graph showing SN ratio deterioration factor in a detection process.
Figure 19:
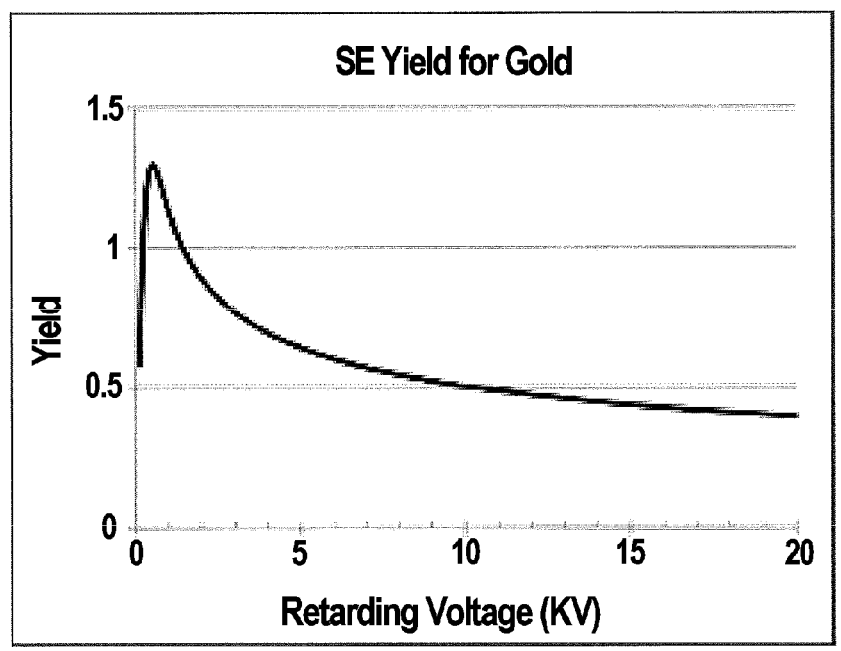
FIG. 19 is a graph showing secondary electron (tertiary electron) yield in the target plate detection method.

The above-described RT can be approximated by the square root of the sum of squares of an RT width (e.g., the longer one of the rise time and the fall time, a width of transit time) in each of the signal conversion process, the transmission process, and the amplification process. When each of the above-described values of RT is substituted into the above equation, the resultant bandwidth BW is 100 MHz or more. Therefore, a high-speed pixel rate of 100 MHz can be realized. Further, since each of the scintillators 16a, 17a has a high luminance efficiency, a value of PcNq can fall within a range of 3 to 6, even in consideration of the optical transmission loss of the light guides 16b, 17b. Therefore, the SN-ratio deterioration factor $1/F_2$ of about 0.9, shown in the right-side graph of FIG. 18, can be maintained, and a sufficiently good SN ratio can be obtained as compared with the target method which depends on the secondary electron yield.

It is necessary for the scintillators 16a, 17a to satisfy the condition that the scintillators 16a, 17a, which are located on or near the beam axis, should not have any influence on the primary beam. In order to satisfy this condition, according to the technique of the present invention, the entireties of the scintillators 16a, 17a and the light guides 16b, 17b are coated with metal film, such as aluminum, and the scintillators 16a, 17a and the light guides 16b, 17b are grounded. This is a new feature which has not been found in the conventional scintillator detection system. It has been customary to apply a positive voltage of about 10 KV to a conventional scintillator to impart an acceleration energy to the secondary particles. This potential has had unavoidable adverse effects. Specifically, if the scintillator is disposed non-axisymmetrically, then the potential improperly deflects the primary beam, and if the scintillator is disposed axisymmetrically on the axis, then aberrations are produced by a lens action due to an unintended acceleration or deceleration at the time the primary beam passes through the scintillator.

Since the scintillators 16a, 17a have the ground potential, the energy of the secondary particles that cause the scintillators 16a, 17a to emit the light is given by the acceleration energy generated by the retarding potential. In this manner, the retarding potential serves to cause the primary beam to have a low landing energy, and further serves to accelerate the secondary particles to cause the scintillators 16a, 17a to emit light. Therefore, for detecting the secondary electrons, it is necessary to apply a retarding potential of −6 KV or more to the specimen 11. In other words, unless the retarding potential is applied to the specimen 11, the secondary electrons cannot be detected and only the back-scattered electrons having high energy can be detected. The specimen table 14 is required to have a capability of withstanding a high voltage of −15 KV or more.

Figure 4:
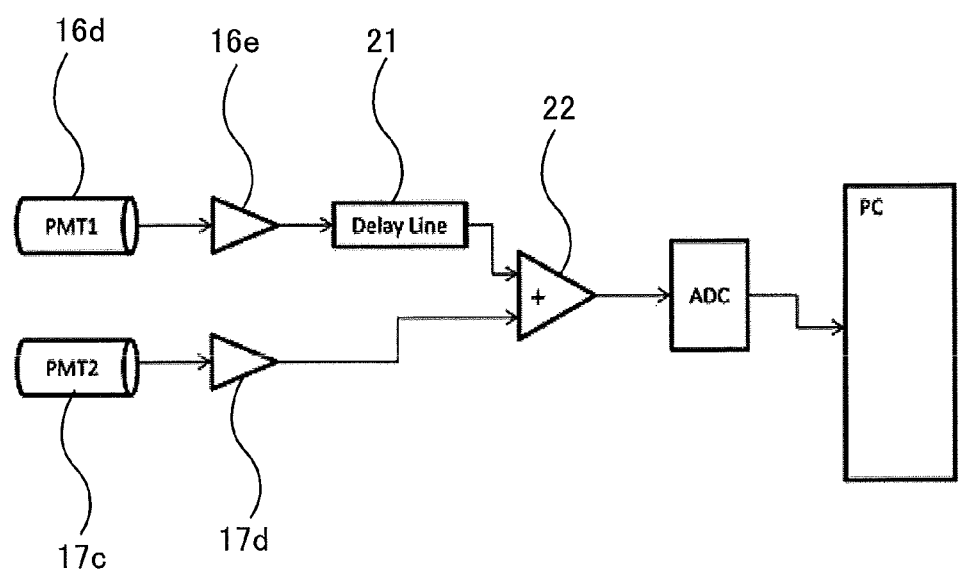
FIG. 4 is a diagram of a delay circuit for an output signal of the first scintillation detector.

The second scintillator 17a is located farther away from the specimen 11 than the first scintillator 16a. Therefore, even if the secondary particles leave the surface of the specimen 11 at the same time, there is a difference in arrival time of about 1 ns due to the difference in distance. This time difference can be a cause of blur between pixels when performing ultra-high-speed scanning at 100 MHz or more. For example, at a pixel rate of 100 MHz, a time allocated to one pixel is 10 ns. In this case, if there is a time difference of 1 ns between the output signal of the second scintillation detector 17 and the output signal of the first scintillation detector 16 and if their output signals are simply added together, the output signals between adjacent pixels are mixed by 10%. The percentage of the mixture increases as the pixel rate rises. For example, when the pixel rate is 300 MHz, the percentage of the mixture increases to 30%. In order to eliminate this, as shown in FIG. 4, a delay circuit 21 for delaying the signal output is coupled to the first amplifier 16e which is coupled to the photo-multiplier tube (PMT) 16d of the first scintillation detector 16. This delay circuit 21 is configured to delay the output signal of the first scintillation detector 16 such that the output signal of the first amplifier 16e coupled to the photo-multiplier tube (PMT) 16d and the output signal of the second amplifier 17d coupled to the photo-multiplier tube (PMT) 17c arrive at an adder circuit 22 simultaneously. Use of such delay circuit 21 can ensure the above-described high-speed response characteristic and can realize an ultra-high response detection wherein the signals between adjacent pixels are not mixed at all.

Figure 3:
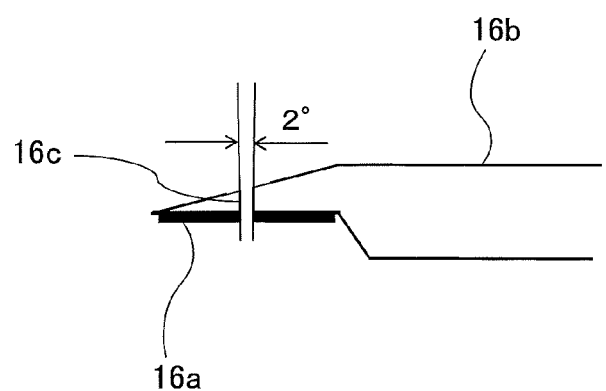
FIG. 3 is a diagram illustrating a taper angle of a passage hole formed in the first scintillation detector disposed below the second scintillation detector.

The secondary particles 103 have a divergence angle of about 2° with respect to the beam axis. If the passage hole 16c has a cylindrical shape having a vertical wall, about 10% of the secondary particles having a divergence angle of ±10 that have passed through the entrance of the passage hole 16c collide with the wall and are lost. Thus, as shown in FIG. 3, the wall surface of the passage hole 16c of the first scintillation detector 16 is in a shape of an inverted frustum of a cone having a slope angle corresponding to the divergent angle of secondary particles 103 so as to prevent the secondary particles from impinging on the wall surface of the passage hole 16c.

The Wien filter 7 is configured to deflect the backwardly-traveling secondary particles 103 in one direction, while allowing the primary beam 101 to travel straight. Although the primary beam can travel straight, the primary beam is affected in various ways by the electromagnetic field of the Wien filter 7. In particular, the effect increases when the energy of the secondary particles to be deflected is close to the energy of the primary beam. If this is ignored, the primary beam is adversely affected when the primary beam is narrowed into a thin beam of about 1 nm. For example, the primary beam diverges in one direction because a focusing action is generated in an electrode direction in which the field imparts a force, while a force does not act in a magnetic-pole direction perpendicular to the electrode direction. As a result, astigmatism occurs in the primary beam. This can be easily solved, as shown in FIG. 5, by applying the correction voltage V2 for stigmatic focus to the magnetic poles 7b in a direction perpendicular to the acting force.

Another effect as a first-order aberration is energy dispersions due to an energy width ΔE of the primary beam. For example, under the operating conditions wherein the primary beam is accelerated at 15 KV to travel straight and the secondary particles are deflected by 10°, if the energy spread ΔE of the primary beam is 0.5 eV, the spread of the beam on the surface of the specimen 11 reaches 1 nm or greater, making it impossible to narrow the beam into a thin beam of about 1 nm.

This problem can be solved by forming the crossover of the primary beam at the center of the EXB field of the Wien filter 7. The mechanism of this is such that, using the fact that the trajectories are reversed at the crossover with respect to the axis, the energy dispersions which occur in a uniform field in the front half from the center of the EXB are canceled by the oppositely oriented energy dispersions which occur in a uniform field in the rear half from the center. This technique is also effective to cancel out second-order aberrations in a uniform field with the same mechanism. According to this technique, the main aberrations of the EXB can be reduced below a level which is required to achieve a beam diameter of 1 nm.

However, this technique is not effective for aberrations caused by a fringe field at the boundary of the field. Since a sign of a term of first derivation of the electric field and the magnetic field at an exit boundary is reversed with respect to a sign at an entrance boundary. Therefore, even when the sign of the trajectories is reversed at the crossover, aberrations terms produced thereby do not cancel out each other, and are added as their signs become the same. That is, the crossover of the primary beam formed at the center of the EXB field is able to cancel out the main aberrations caused by the uniform fields, but cannot completely eliminate a contribution of the fringe field. Furthermore, since it is difficult to establish a method of checking the fact that the crossover is formed at the center of the EXB and an accuracy of the method is uncertain, the position of the crossover may be displaced depending on how adjustments are made. In minimizing the effects of these uncontrollable factors, it is sensible to excite the EXB as weakly as possible so as to minimize those effects. From this standpoint, in order to minimize the deflection angle of the secondary particles deflected by the EXB and to detect the secondary particles which are not far from the axis, the distal end of the second scintillator 17a is spaced from the axis of the primary beam in the range of about 0.5 mm to 2 mm which is a requisite minimum. This allows the EXB to have the deflection angle of about 5° which is a sufficient angle, thereby reducing the electromagnetic field itself of the EXB to minimize the effect on the primary beam.

Figure 7:
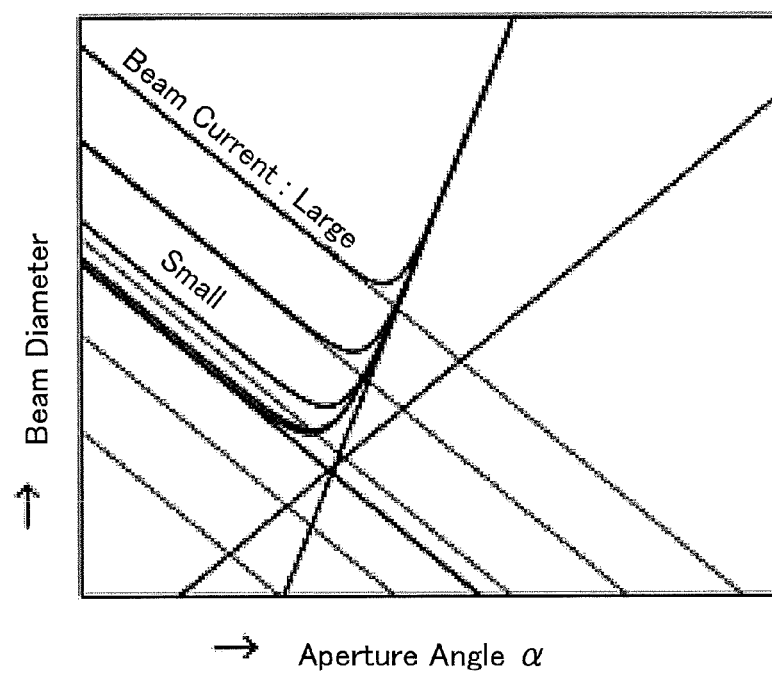
FIG. 7 is a diagram showing an optimum aperture angle of an objective lens.

Obstacles to achieving a high resolution include, in addition to the coulomb interaction, aberrations developed in the primary beam by the objective lens 8. These aberrations include diffraction aberration, chromatic aberration, and Seidel's five aberrations, and are given as functions of the aperture angle of the objective lens 8. There is an optimum aperture angle for minimizing the sum of squares of these aberrations. The optimum aperture angle varies depending on the beam current as shown in FIG. 7. Therefore, the beam current has to be set to a desired value by the condenser lenses 3, 5, 6, while the aperture angle of the objective lens 8 has to be set to an optimum value for each current. Furthermore, the requisite condition is newly added which is to form the crossover at the center of the EXB of the Wien filter 7. These three conditions can be satisfied by the three-series condenser lenses 3, 5, 6, as discussed below.

The beam current value is set by adjusting the position of the crossover formed in front of the current restriction aperture 4 by the first condenser lens 3. Specifically, a beam flux spreads uniformly on the current restriction aperture 4 having a fixed hole area, and its area is varied in accordance with the position of the crossover formed by the first condenser lens 3. Specifically, a current passing through the current restriction aperture 4 is determined from a ratio of an area, covered by all the current spreading on the current restriction aperture 4, to the hole area. Therefore, the current is reduced with a distance of the crossover position from the current restriction aperture 4.

The second condenser lens 5 is disposed below the first condenser lens 3 and the current restriction aperture 4. The second condenser lens 5 is adjusted so as to form an image of the crossover formed by the first condenser lens 3, at the center of the EXB of the Wien filter 7. For this purpose, a single condenser lens may be enough to achieve the function, but it has no degree of freedom for adjusting an angular magnification to a desired value. Since the objective lens 8 has its own mission to form an image the crossover at the center of the EXB on the surface of the specimen 11, the angular magnification is automatically determined and there is no room to adjust it. A conventional system of two-series condenser lenses has been set to have an optimum aperture angle by adjusting a position of a crossover formed by a second condenser lens, i.e., a distance between an objective lens and the crossover. However, this method cannot be used in the present invention.

Figure 8:
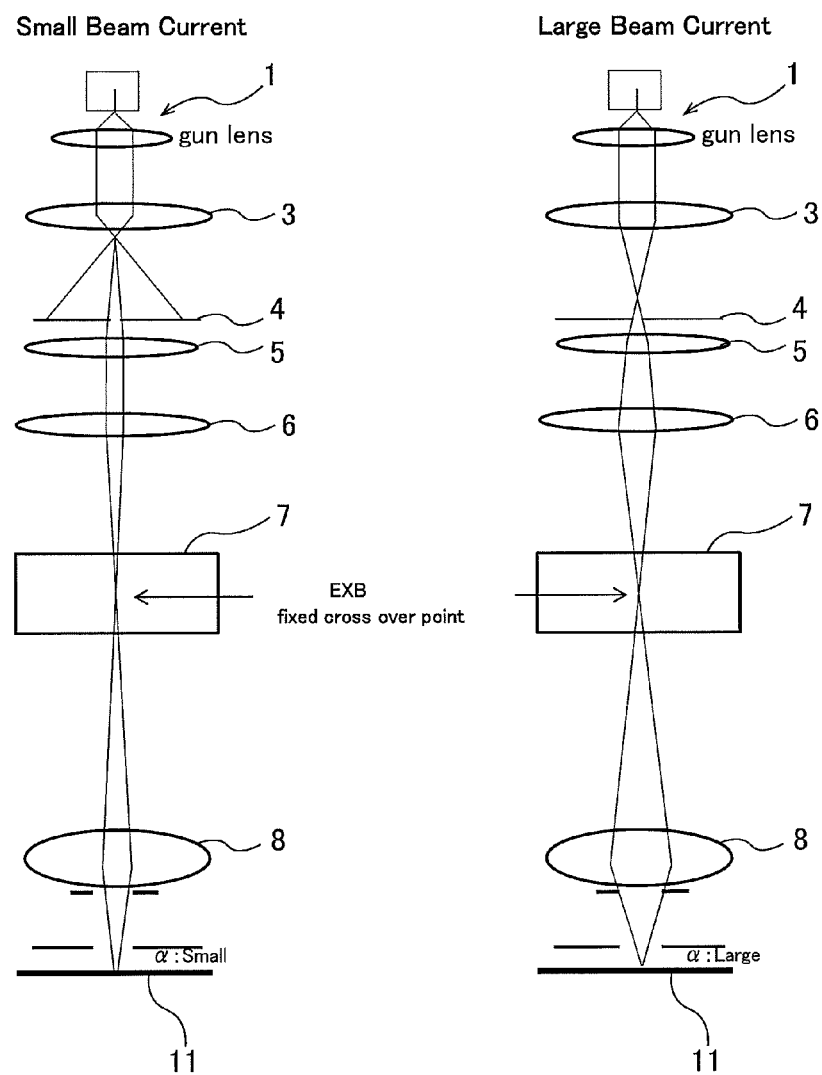
FIG. 8 is a diagram showing an example of a primary beam trajectory in a case of two crossovers.

The angular magnification can be adjusted by the condenser lens 6. Even if the position of the image point is fixed at the center of the EXB by a combined lens constituted by the two lenses; the first condenser lens 3 and the second condenser lens 5, there is created a degree of freedom for independently adjusting the angular magnification. In this manner, the three-series condenser lenses 3, 5, 6 can simultaneously satisfy the three independent requisite conditions, i.e., to be able to vary the beam current in the range of 10 pA to 100 nA, to optimize the divergence angle of the primary beam entering the objective lens 8, and to fix the position of the crossover at the center of the EXB of the Wien filter 7. FIG. 8 illustrates a typical ray path.

As discussed above, the first condenser lens 3 forms the crossover in front of the current restriction aperture 4 so that the current is controlled. According to this method, a wide current variable range can be established. However, since this method entails forming the two crossovers including the crossover at the center of the EXB, this method is not desirable from the standpoint of reducing the coulomb interaction. In particular, a large current including unwanted currents converges in the crossover in front of the current restriction aperture 4, and as a result, the coulomb interaction at the point is increased.

Figure 9:
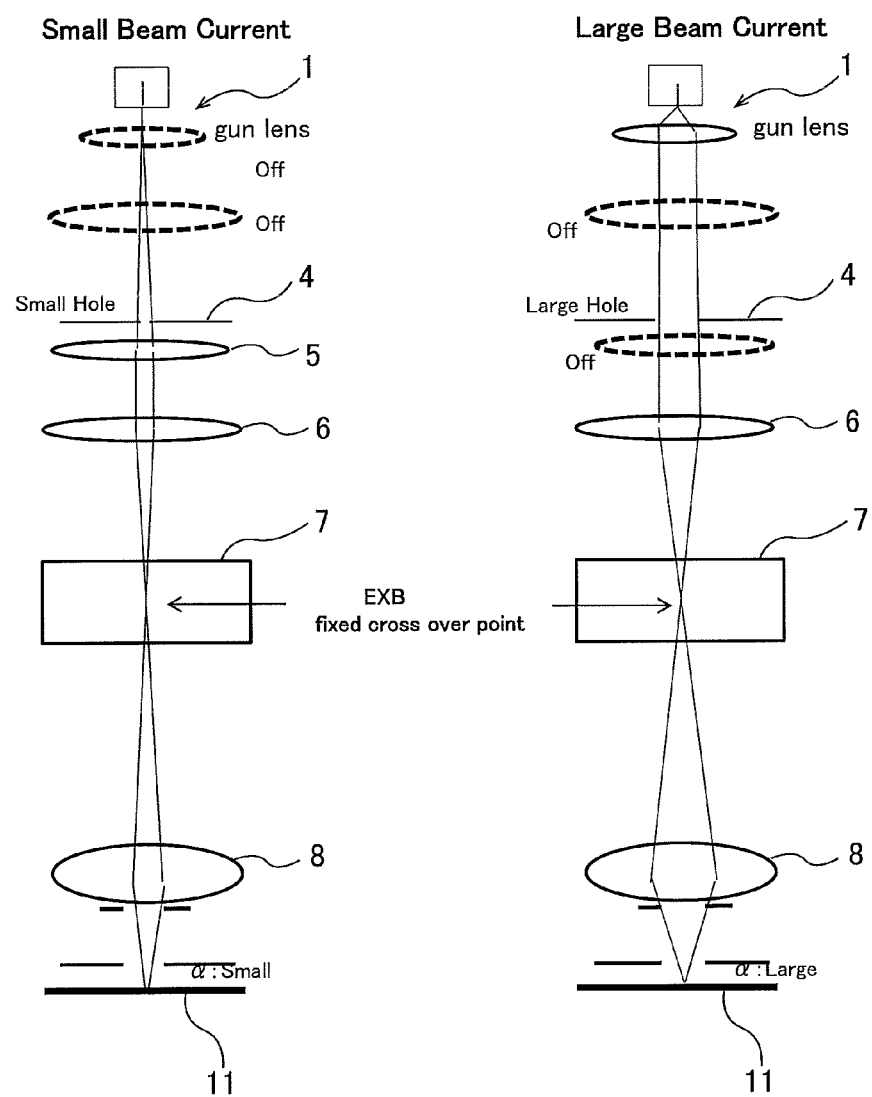
FIG. 9 is a diagram showing an example of a primary beam trajectory in a case of a single crossover.

Thus, as a second method of varying the current, no crossover is formed in front of the current restriction aperture 4, while the first condenser lens 3 forms parallel beams that can form an image at an infinite distance, and the hole diameter of the current restriction aperture 4 is made variable for variably controlling the current. FIG. 9 illustrates such a ray path. Also in this case, the second condenser lens 5 and the third condenser lens 6 form the crossover at the center of the EXB of the Wien filter 7, and the aperture angle of the objective lens 8 is adjusted to an optimum value. Since the crossover at the center of the EXB includes only a beam current which is a requisite minimum, the coulomb interaction is minimized. However, each time the beam current is varied, the hole size and the position of the current restriction aperture 4 should be finely adjusted.

Thus far, the embodiments of the detection system for the secondary electrons have been described. Next, the detection of high-energy back-scattered electrons will be described below.

When observing a pattern shape of a semiconductor device with a high resolution, a secondary electron image generated with a low landing energy which may cause small damage is utilized. On the other hand, when obtaining inside information of the specimen 11, e.g., in order to learn about an accuracy of superposition of an overlay or a state of a bottom of a deep hole, it is necessary to utilize back-scattered electrons having energy enabling a large permeability. A depth to which the primary beam can penetrate into the specimen 11 is proportional to a power of the landing energy. For example, a landing energy of about 40 KeV is required for observing a layer which is about 10 μm deep. In order to observe an SEM image as well, a retarding voltage of about −10 KV is required to accelerate the secondary electrons. Therefore, an acceleration voltage of 50 KV is necessary.

Many back-scattered electrons, which have been emitted at low angles with respect to the surface of the specimen 11, have been reflected many times from a deep layer in the specimen 11. These back-scattered electrons have traveled in zigzag paths over long distances until they leave the specimen 11. The back-scattered electrons entail energy loss proportional to their travel distances, and have low energy when they leave the specimen 11. These low-angle back-scattered electrons (low-angle BSE) carry information about the deep layer. The low-angle back-scattered electrons have large momentum in radial directions while their energy is low. Therefore, the trajectories of the back-scattered electrons spread widely in the radial directions even when the back-scattered electrons are accelerated in the beam axial direction by the acceleration electric field, and the back-scattered electrons enter the low-angle back-scattered electron detector 20 attached to the lower surface of the objective lens 8, so that the back-scattered electrons are detected there.

The low-angle back-scattered electron detector 20 comprises a semiconductor detector which is configured to detect back-scattered electrons having energy of 10 KeV or more. The larger the incident energy is, the greater the output of the semiconductor detector is. However, the gain of the semiconductor detector is double or triple digits smaller than the PMT. Therefore, it is necessary to increase an amplification factor of a small-current amplifier, and as a result, the bandwidth is narrowed. As such, it is difficult to achieve a scanning speed (or pixel rate) of 10 MHz or higher.

On the other hand, many high-angle back-scattered electrons, which have been emitted at high takeoff angles, have been reflected only one time in a shallow region within the specimen 11. Since the high-angle back-scattered electrons have traveled over short distances until they leave the specimen 11, the energy loss is small. The high-angle back-scattered electrons have high energy close to the landing energy, while they have small momentum in the radial directions. As a result, the high-angle back-scattered electrons travel back upstream in trajectories near the beam axis, as well as the secondary electrons. These high-angle back-scattered electrons carry information mainly about a composition of a surface layer.

The scintillators 16a, 17a are made of a special material whose decay time is very short in order to achieve a high response speed of 100 MHz or higher. Each of the scintillators 16a, 17a made of such a material includes a very thin light emission layer. If the energy of incident electrons exceeds 13 KeV, the electrons penetrate through the light emission layer into an underlying substrate, where the energy of the electrons is consumed at a high percentage. Therefore, if the energy of the incident electrons exceeds 13 KeV, the detection sensitivity starts to drop. For this reason, the scintillators 16a, 17a each having a high response speed are unsuitable for detecting the back-scattered electrons having large energy of, e.g., 50 KeV.

In order to detect the high-angle back-scattered electrons having high energy, the third detector 19, which is highly sensitive in a high energy band, is disposed at the opposite side of the beam axis from the second scintillation detector 17. The Wien filter 7 is configured to be able to switch the deflection direction of the secondary particles 103 between a first direction toward the second scintillator 17a and a second direction toward the third detector 19. By simultaneously switching the polarities of the electrodes and magnetic poles of the Wien filter 7 to reverse the directions of the fields, the deflection direction of the secondary particles 103 is changed without affecting the primary beam traveling straight, thereby directing the back-scattered electrons toward the third detector 19. The third detector 19 comprises a semiconductor detector or a scintillation detector capable of detecting secondary particles having energy in a range of 10 keV to 50 keV. In contrast, the effective detection energy range that is determined by the thickness of the second scintillator 17a is from 6 keV to 12 keV.

In order to detect the back-scattered electrons with no energy separation, the third detector 19 may be either a single-channel semiconductor detector or a scintillator detector suitable for high-energy incidence. In order to obtain more detailed depth information, an energy analyzer 18 is disposed between the third detector 19 and the Wien filter 7. This energy analyzer 18 is configured to separate the back-scattered electrons in accordance with the energy and to detect the energy-sorted back-scattered electrons to thereby specify a depth at which the back-scattered electrons are reflected. The reasons will be described below. The amount of energy loss is proportional to the travelling distance. Therefore, a total travelling distance can be calculated by dividing the amount of energy loss by a stopping power. The high-angle back-scattered electrons emitted in directions close to a direction perpendicular to the surface of the specimen 11 are back-scattered electrons which have been reflected only once. Therefore, the travelling distance can be regarded as twice the depth at which the back-scattered electrons are generated, and hence one-half of the calculated total travelling distance represents the depth at which the back-scattered electrons have been reflected. A composition distribution at a particular depth can be separated based on the two-dimensional distribution information of the back-scattered electrons whose depths of their generation have been specified, as described below.

It is assumed, for example, that a first pattern having a distribution of reflectance $\eta_A(X,Y)$ exists at a depth A from the surface of the specimen 11, a second pattern having a distribution of reflectance $\eta_B(X,Y)$ exists at a depth B from the surface of the specimen 11, and a third pattern having a distribution of reflectance $\eta_C(X,Y)$ exists at a depth C from the surface of the specimen 11. The second pattern lies below the first pattern, and the third pattern lies below the second pattern. If the stopping power is represented by s (eV/Å), amounts of energy loss (i.e., differences between acceleration energies and energies measured by the energy analyzer 18) $\Delta E_A$, $\Delta E_B$, $\Delta E_C$ of the high-angle back-scattered electrons reflected off a layer A, a layer B, and a layer C are expressed by respective equations shown below.

$$\Delta E_A = 2sA$$

$$\Delta E_B = 2sB$$

$$\Delta E_C = 2sC$$

Figure 12:
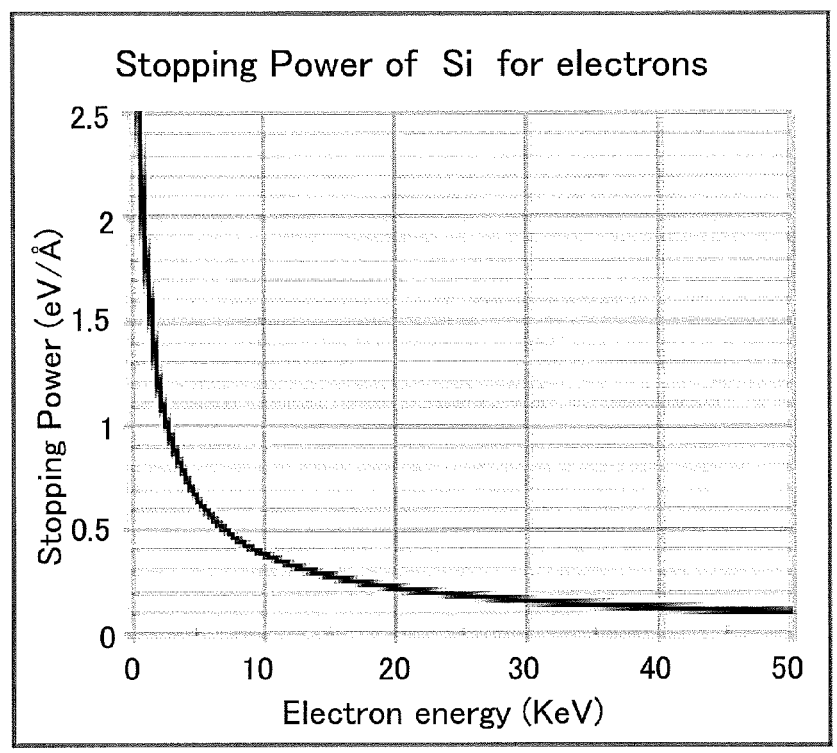
FIG. 12 is a graph showing stopping power of silicon for electrons.
Figure 13:
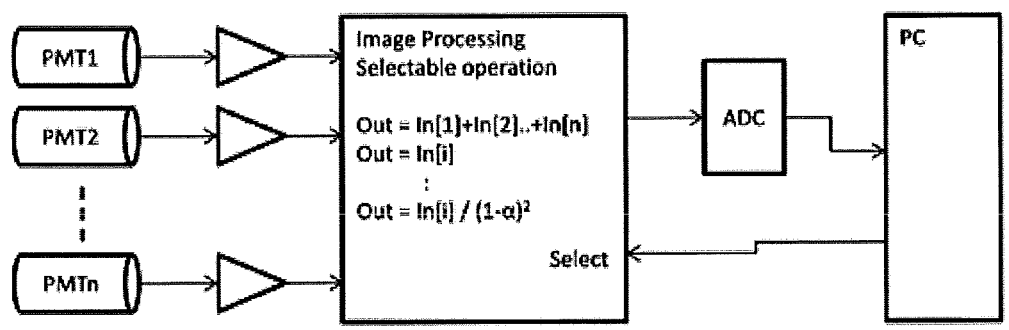
FIG. 13 is a diagram showing a processing flow of multichannel PMT output signals.

Therefore, if $\Delta E_A$, $\Delta E_B$, and $\Delta E_C$ have been specified by measurements, then the generation depths A, B, C are specified according to the above equations. Since the high-angle back-scattered electrons are mostly generated in a shallow layer, s can be regarded as approximately being constant. With respect to Si, s is about 0.12 eV/Å when the landing energy is about 40 KeV, as can be seen from the graph shown in FIG. 12.

Intensity distributions $I(X,Y)$ of back-scattered electrons generated by in-plane reflection distribution patterns $\eta(X,Y)$ in the respective layers can be approximated by the following equations, because the beam is subjected to intensity modulation by pattern distributions in the respective layers when the beam passes through the layers twice, i.e., when travelling forwardly and backwardly.

$$I_A(X,Y) \approx I_O \eta_A(X,Y)$$

$$I_B(X,Y) \approx I_O[1-\eta_A(X,Y)]^2 \eta_B(X,Y)$$

$$I_C(X,Y) \approx I_O[1-\eta_A(X,Y)]^2[1-\eta_B(X,Y)]^2 \eta_C(X,Y)$$

From images $I_A(X,Y)$, $I_B(X,Y)$, $I_C(X,Y)$ that are acquired for the respective energy losses, $\eta_A(X,Y)$, $\eta_B(X,Y)$, $\eta_C(X,Y)$ are determined as follows.

$$\eta_A(X,Y) \approx [I_A(X,Y)/I_O]$$

$$\eta_B(X,Y) \approx [I_B(X,Y)/I_O]/[1-\eta_A(X,Y)]^2$$

$$\eta_C(X,Y) \approx [I_C(X,Y)/I_O]/[1-\eta_A(X,Y)]^2 [1-\eta_B(X,Y)]^2$$

As can be seen from the above equations, the pattern distribution in the first layer can be isolated simply by designating the amount of energy loss (which is almost equal to zero), but the pattern distribution in the layer immediately beneath the first layer cannot directly be isolated simply by designating the energy to specify the depth where electrons are generated. However, although this process becomes more difficult for lower layers, it is possible in principle to derive through calculations an individual pattern distribution in each of the second layer and subsequent layers using the pattern distribution isolated in the upper layer, as indicated by the above equations.

For these calculations, a plurality of scan images for each energy loss can be collected once and can be stored in a memory, and then an image can be calculated.

The energy separation of the high-angle back-scattered electrons for specifying the depth of their generation can be performed by the Wien filter 7 alone. However, strong excitation of the field is needed in order to obtain sufficient energy dispersions. Such strong excitement of the field is not advisable because it means an increase in adverse effect on the primary beam. Accordingly, the energy analyzer 18 is disposed behind the Wien filter 7, thus constituting a tandem dispersion field. The Wien filter 7 is weakly excited to mainly serve as a beam separator for the primary beam and the secondary particles, and further causes the energy dispersions accompanied with the deflection of the secondary particles. For example, when the back-scattered electrons having an energy of 50 KeV are to be deflected by 20° and to be separated from the primary beam by the Wien filter 7, a voltage of ±6.2 KV is applied to the electrodes 7a and an exciting ampere turn for the magnetic poles 7b is 75 AT. A contribution rate of the energy dispersions occurring at this time to an energy resolution, which will be described later, is about 12%.

An electrostatic sector field formed by the energy analyzer 18 is separated from the primary beam by a shield plate which is grounded potential. Therefore, strong excitation of the energy analyzer 18 does not cause any problem. The electrostatic sector field is able to obtain large energy dispersions in combination with the dispersions by the EXB field of the Wien filter 7. This tandem deflection field has not only the energy dispersing action, but also has an image forming action. Particles having various energies emitted with certain divergence angles from one point of the light source are energy-dispersed on an image plane, and form a source image focused at each separated energy. Because of this image forming action, the energy resolution is defined as "a size of the formed light source image=the amount of dispersion". The actual true light source is a raster-scanning range (FOV) of the primary beam on the surface of the specimen 11. The secondary particles that have been emitted from the specimen 11 spread over various areas on the surface of the first scintillator 16a, because strength of the fields sensed in the objective lens 8 and the electrostatic deflection system 9, through which the secondary particles have passed on their way, are different according to the energy. Only the secondary particles that have passed through the passage hole 16c are directed to the tandem deflection field. Therefore, the passage hole 16c of the first scintillator 16a serves as a virtual light source for the tandem deflection field. This virtual light source forms an image on the image plane with a certain magnification which is determined by the image forming action of the tandem deflection field.

The electrostatic sector field may be of a hollow cylindrical type or a spherical type. Since the latter type provides the dispersion which is twice that of the former type, and provides a focusing action also in a plane perpendicular to the dispersing direction, the latter type is better than the former type and is employed in this embodiment.

Figure 10:
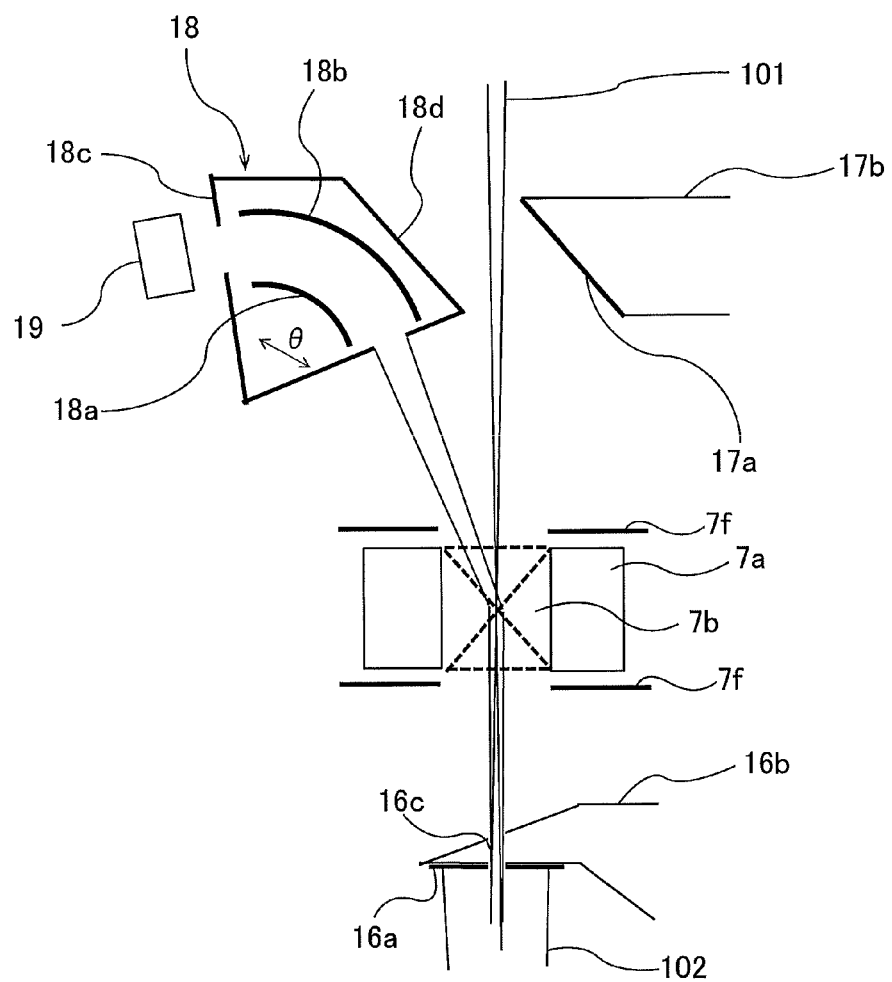
FIG. 10 is a diagram showing a layout of an energy analyzer for back-scattered electrons (BSE)

FIG. 10 is a view showing the energy analyzer 18. The energy analyzer 18 includes an inner spherical electrode 18a, an outer spherical electrode 18b, a Herzog end plat 18c, and a grounded shield plate 18d. The inner spherical electrode 18a and the outer spherical electrode 18b are surrounded by the Herzog end plat 18c and the grounded shield plate 18d.

In the electrostatic sector field of the spherical type, where an outside radius of the inner spherical electrode 18a is represented by a, an inside radius of the outer spherical electrode 18b is represented by b, and the energy of incident particles is represented by Vo, voltages V(a), V(b) applied to the respective electrodes 18a, 18b are given by the following equations.

$$V(a)/Vo = (b-a)/a$$

$$V(b)/Vo = -(b-a)/b$$

$$V(\text{center})/Vo = 0$$

As described above, the central potential V(center) at the center between the electrodes is the ground potential. The Herzog end plate 18c and the grounded shield plate 18d, which are grounded for defining a boundary of the electrostatic sector field, are installed at an entrance side and an exit side of the electrostatic sector field.

For example, in an embodiment in which a=38 mm, b=52 mm, and Vo=50 KeV, the following voltages are applied to the electrodes 18a, 18b, respectively.

$$V(a) = 18.4 \text{ KV}$$

$$V(b) = -13.5 \text{ KV}$$

A central trajectory has a radius r which is given by r=(a+b)/2=45 mm. A distance from the entrance of the electrostatic sector field to the virtual light source is set to about 100 mm=2.2r.

The distance from the entrance of the electrostatic sector field to the virtual light source has an influence on the image forming magnification. Specifically, the longer the distance is, the smaller the image forming magnification becomes. On the other hand, the second-order aberrations become larger with the distance. Therefore, it is preferable to select the channel size of the third detector 19 such that a size of the formed image of the virtual light source becomes equal to the channel size, in view of a balance between the image forming magnification and the second-order aberrations, and to further select the image forming magnification corresponding to the selected channel size. For example, where the channel width of the third detector 19 is 1 mm and the width of the virtual light source is 2 mm, the image forming magnification is determined to be 0.5. A ratio between the distance and the central trajectory radius which give the above determined magnification is determined. Once either one of them is determined, the other is uniquely determined.

A sector angle θ is selected in view of a balance between the image forming magnification and the second-order aberrations, both of which are factors for determining the resolution. In this embodiment, the sector angle θ is in a range of 80° to 90°. An angle perpendicular to the sector, which is in a range of 100° to 120°, may be sufficient for the uniformity of the field in the vicinity of the central trajectory.

The energy resolution E/ΔE by the tandem deflection field is given by $$E/\Delta E = (r/W)[2(1+M)+0.4]/2M$$

where W represents the size of the virtual light source, and the second term 0.4 in the brackets on the right side represents a contribution of EXB field when the deflection angle is 20°. When the sector angle θ is 80°, an image is formed with an image forming magnification M≈0.5 at a position spaced by 0.7r from the exit of the sector field.

When the size W of the virtual light source is 2 mm (diameter), since the image forming magnification is about 0.5, the expected energy resolution E/ΔE becomes around 77. Therefore, the energy bandwidth ΔE that can be separated at the incident energy of 50 KeV is calculated as ΔE=50/77≈0.65 KeV. Since the stopping power s is about 0.12 eV/Å when the landing energy is 40 keV, a depth resolution, which is converted from the value of the energy bandwidth ΔE, is about 270 nm. If a higher depth resolution is necessary, the landing energy is lowered to thereby increase the stopping power. For example, if the acceleration voltage is 30 KV and the retarding voltage is 10 KV, the landing energy is 20 KeV. In this case, the stopping power s is 0.22 eV/Å, and the energy bandwidth ΔE is ΔE=30/77≈0.39 KeV, which corresponds to a depth resolution of about 90 nm.

Figure 11:
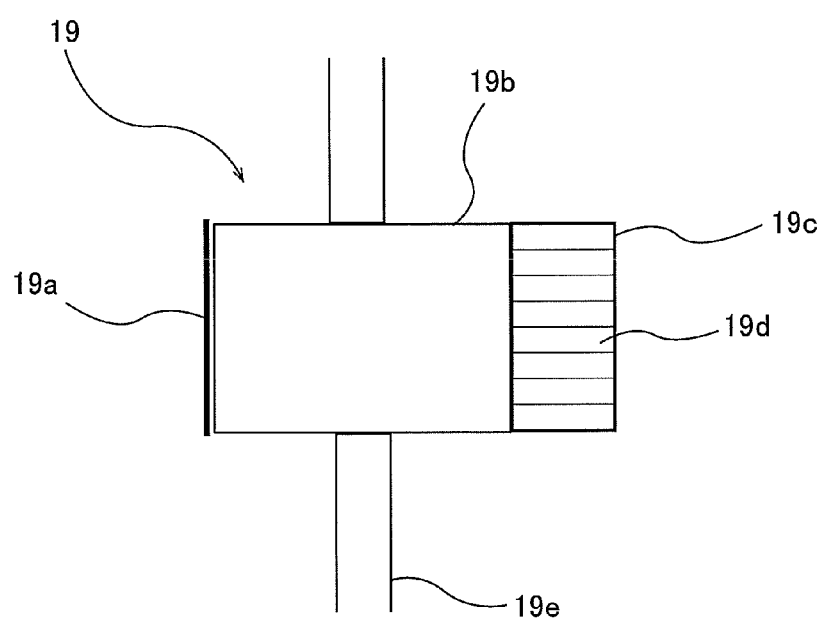
FIG. 11 is a diagram showing a structure of a one-dimensional multichannel detector.

FIG. 11 is a diagram showing the third detector 19. In this embodiment, the third detector 19 comprises a multichannel-array semiconductor detector disposed at the image forming plane of the tandem deflection field. The third detector 19 includes a scintillator 19a having enough thickness to detect at most 50 KeV, an optical element (or a fiber optic plate) 19b arranged behind the scintillator 19a, and a multichannel PMT array detector 19c having 16 channels. Reference numeral 19d represents a channel array, and reference numeral 19e represents a wall of a vacuum chamber. The multichannel detector 19c is configured to separate charged particles in accordance with energy bands of the 16 channels and to detect the separated charged particles simultaneously.

Use of the multichannel PMT entails a high gain, but there is no scintillator which can simultaneously satisfy both the sensitivity for high energy and the high response speed. If fluorescent material P47 is used as the scintillator, a film thickness can freely be controlled since P47 is a powdery material, and the scintillator can be fabricated so as to have such a thickness that the back-scattered electrons do not penetrate through the light emission layer even if the incident energy is 50 KeV. The scintillator thus fabricated cannot be used for a high-speed scanning, because its decay time is 80 ns, but it can cope with a pixel rate of at least 10 MHz. On the other hand, the third detector 19, comprising the multichannel semiconductor detector, can cope with a high incident energy of 50 KeV, but there is a limitation of higher-speed designs, because a gain is double digits lower than the PMT. Although any of these detectors has its response speed of not more than 10 MHz, they are effective to detect high-energy particles of 50 KeV.

When the electrons, which have been dispersed in trajectories, collide with the electrodes 18a, 18b of the energy analyzer 18, some of the electrons are reflected and enter the third detector 19. These reflected electrons travel in trajectories which are different from the original energy-dispersion trajectories. Therefore, these electrons do not contribute to an energy spectrum, and become background signals or may cause a ghost spectrum. In addition, hard X-rays are emitted from a point of collision. The hard X-rays enter the third detector 19, thereby becoming the background which lowers the SN ratio of the energy spectrum.

In order to prevent this, the inner spherical electrode 18a and the outer spherical electrode 18b of the energy analyzer 18 are formed by material composed of an element having low atomic number, such as graphite (e.g., carbon) or fluororesin (e.g., carbon and fluorine), so that the above-described adverse effects can be greatly reduced. If the material has an insulation property, the surface of the material is coated with conductive carbon. Light elements have a low electron reflectance and do not emit hard X-rays. Therefore, use of the light elements results in a great improvement in the SN ratio.

The energy analyzer 18 has a limitation of an energy range that can be detected at a time. This energy range is determined by a gap width of the sector electric field and the number of channels of the detector. When the back-scattered electrons (BSE) of 50 KeV are separated according to energy with the gap width of 15 mm, the energy width that can be detected simultaneously is at most about 9.7 KeV. Consequently, the high-energy BSE of about 50 KeV and the secondary electrons (having the same energy as the retarding voltage) which have the energy of 10 KeV cannot be simultaneously detected by the third detector 19.

The secondary electrons may preferably be detected by the first scintillation detector 16. However, the FOV of the BSE that can pass through the passage hole 16c of the first scintillator 16a is at most 50 µm, and most of the secondary electrons generated from that range converge around the axis and pass through the passage hole 16c. Therefore, under a normal condition (the regarding voltage: −10 KV), the first scintillation detector 16 cannot detect the secondary electrons in the FOV of 50 µm or less. This is inconvenient because a surface topographic image, which is to serve as a reference for BSE observation, cannot be seen. Therefore, when the Wien filter 7 is defecting the secondary electrons and the back-scattered electrons toward the third detector 19, some means is required to capture these secondary electrons.

One solution is to install a field control plate (FCP) 10 having a central hole for passing the primary beam and the secondary particles therethrough. The field control plate (FCP) 10 is disposed at a distance from the specimen 11, and the retarding voltage±offset voltage is applied to the FCP 10. A FCP control power source 12 is coupled to the FCP 10 and the retarding power source 13. A voltage of at most −20 KV is applied to the FCP 10. Therefore, it is necessary to provide a voltage withstanding gap in a range of at least 4 mm to 5 mm between the FCP 10 and the low-angle back-scattered electron detector 20 which has the ground potential. In order to produce an electric field-free condition between the FCP 10 and the specimen 11, the offset voltage of ±3 KV is needed to be added to the retarding voltage. As a voltage withstanding space for this, a gap of 1 mm is required between the FCP 10 and the surface of the specimen 11.

The FCP 10 performs the following two actions: (1) By applying the retarding voltage±the offset voltage to the FCP 10, the FCP 10 can adjust the strength of the acceleration lens field for the secondary electrons, and can control the convergence of the secondary electrons on the detection plane of the first scintillator 16a. (2) Adjusting the offset voltage creates an electric field-free space between the specimen 11 and the FCP 10. This electric field-free space causes some of the secondary electrons to return backward when the specimen 11 is positively charged up, thereby lessening the charge up.

FIG. 14 shows a result of a simulation of spreading trajectories of the back-scattered electrons (BSE) on the detection plane of the first scintillator 16a. This simulation was conducted under the conditions that the acceleration voltage was 50 KV, the retarding voltage was −10 KV, the landing energy was 40 KeV, and the voltage applied to the FCP 10 was −8.3 KV. This simulation was for BSE with no energy loss, i.e., BSE of 50 KeV. A circle surrounding the center represents the passage hole 16c having a diameter of 2 mm, and nine small circles represent incident positions of BSE and spreading of BSE beams generated at the center and eight points at the outermost periphery of FOV of 100 μm. The scale of the overall screen is 10×10 mm. FIG. 15 shows spreading trajectories of secondary electrons under the same conditions as FIG. 15. The scale of the overall screen is 20×20 mm. FIG. 16 shows spreading trajectories of the secondary electrons when the voltage applied to the FCP 10 was adjusted to −10 KV. The scale of the overall screen is 20×20 mm. It can be seen that the secondary electrons generated from the center of the FOV are also captured by defocusing. These figures illustrate the emission angle from the surface of the specimen 11 up to 80° in an increment of 20°.

The secondary electrons, which could not be detected in the absence of the FCP 10, are thus detected with the first scintillator detector 16 by adjusting the spread of the secondary electrons on the detection plane of the first scintillator 16a through adjustment of the offset voltage for the FCP 10. At the same time, the high-energy BSE are detected by the third detector 19.

The reason why the information of the secondary electrons is useful for observing the back-scattered electrons is as follows. There are two types of secondary electrons; one of which is secondary electrons excited by the primary electrons, and the other is secondary electrons excited by the back-scattered electrons. The secondary electrons directly generated by the primary electrons contain topographic information of the surface of the specimen 11. Therefore, high edge contrast appears on an image created from such secondary electrons. In contrast, the secondary electrons excited by the back-scattered electrons carry information about a deep layer of the specimen 11 and a bottom of a hole in the specimen 11 at which the back-scattered electrons as an excitation source have been reflected. An image of these secondary electrons, an image of the low-angle back-scattered electrons (low-angle BSE) whose energy loss has been specified, and an image of the high-angle back-scattered electrons (high-angle BSE) are compared with each other to provide information about surface irregularities, surface compositions, inner structures, and hole bottoms separately.

What is claimed is:

1. A scanning electron microscope comprising:
    a retarding power source configured to apply a retarding voltage, which is a negative voltage, to a specimen to reduce a landing energy of a primary beam;
    a combined objective lens configured to form an electric field and a magnetic field superimposed on one another and to focus the primary beam on a surface of the specimen;
    an electrostatic deflection system configured to deflect the primary beam, which has been narrowed by the combined objective lens, to direct the primary beam to each point in a field of view on the surface of the specimen;
    a first scintillation detector having a first scintillator configured to emit light upon incidence of secondary electrons which have been emitted from the specimen and accelerated in an axial direction of the primary beam by the retarding voltage and have passed through the combined objective lens, the first scintillator being grounded and arranged on an axis of the primary beam, the first scintillation detector having a passage hole for allowing the primary beam to pass therethrough;
    a Wien filter arranged upstream of the first scintillator and configured to deflect the secondary electrons, which have passed through the passage hole, in one direction without deflecting the primary beam;
    a second scintillation detector having a second scintillator configured to detect the secondary electrons deflected by the Wien filter, the second scintillator being grounded and having a distal end located away from the axis of the primary beam; and
    a third detector configured to detect secondary particles emitted from the specimen,
    wherein the third detector is disposed at an opposite of the axis of the primary beam from the second scintillation detector, and
    wherein the Wien filter is configured to reverse vectors of an electric field and a magnetic field simultaneously to switch a deflection direction of the secondary particles between a first direction toward the second scintillation detector and a second direction toward the third detector.

2. The scanning electron microscope according to claim 1, wherein the distal end of the second scintillator is located away from the axis of the primary beam by a distance ranging from 0.5 mm to 2 mm.

3. The scanning electron microscope according to claim 1, wherein:
    the first scintillation detector further includes a first photo-multiplier tube configured to convert the light into electrons, a first light guide configured to transmit the light, emitted in the first scintillator, to the first photo-multiplier tube, and a first amplifier configured to amplify an output signal of the first photo-multiplier tube;
    the second scintillation detector further includes a second photo-multiplier tube configured to convert light into electrons, a second light guide configured to transmit the light, emitted in the second scintillator, to the second photo-multiplier tube, and a second amplifier configured to amplify an output signal of the second photo-multiplier tube; and
    a decay time of each of the first and second scintillators is not more than 2 nanoseconds, a width of a light-transit time in each of the first and second light guides is not more than 1 nanosecond, and widths of rise and fall times of a pulse of each of the first and second photo-multiplier tubes are not more than 1 nanosecond, and a bandwidth of each of the first and second amplifiers is at least 150 MHz.

4. The scanning electron microscope according to claim 1, further comprising:
    an adder circuit configured to add an output signal of the first scintillation detector and an output signal of the second scintillation detector; and
    a delay circuit disposed between the first scintillation detector and the adder circuit, the delay circuit being configured to delay the output signal of the first scintillation detector such that the output signal of the first scintillation detector and the output signal of the second scintillation detector arrive at the adder circuit simultaneously.

5. The scanning electron microscope according to claim 1, wherein the passage hole is in a shape of an inverted frustum of a cone having a slope angle ranging from 1 degree to 2 degrees.

6. The scanning electron microscope according to claim 1, further comprising a condenser lens system configured to form a crossover of the primary beam at a center of the Wien filter, so that energy dispersion and second-order aberrations of the primary beam, which are generated at the Wien filter, can be suppressed and an optimal value of a divergence angle of the crossover for obtaining a minimum beam diameter can be established.

7. The scanning electron microscope according to claim 6, wherein the condenser lens system includes at least three condenser lenses which are configured to be able to simultaneously satisfy three conditions, which are to allow a beam current to vary in a range of 10 pA to 100 nA, to optimize a divergence angle of the primary beam entering the combined objective lens for each beam current, and to form the crossover at the center of the Wien filter at all times.

8. The scanning electron microscope according to claim 1, wherein the Wien filter is configured to be able to deflect the secondary particles to the second scintillation detector at a deflection angle of not more than 10 degrees and to deflect the secondary particles to the third detector at a deflection angle of at least 20 degrees.

9. The scanning electron microscope according to claim 1, wherein the Wien filter has electrodes and magnetic poles which are formed by permalloy.

10. The scanning electron microscope according to claim 9, wherein the Wien filter has boundary-limiting plates secured to an upper surface and a lower surface of the Wien filter, the boundary-limiting plates being formed by permalloy.

11. The scanning electron microscope according to claim 1, wherein an effective detection energy range, which is determined by a thickness of the second scintillator, is from 6 keV to 12 keV, and
wherein the third detector comprises a semiconductor detector or scintillation detector suitable for detecting secondary particles having energy in a range of 10 keV to 50 keV.

12. The scanning electron microscope according to claim 1, further comprising an energy analyzer arranged between the third detector and the Wien filter,
wherein the Wien filter and the energy analyzer are configured to form a deflection field and a sector field, respectively, constituting a tandem deflection field, the passage hole of the first scintillation detector serves as a virtual light source, the third detector is located at an image forming plane of the tandem deflection field, and
the third detector has a multichannel detector configured to separate charged particles in accordance with energy band and to detect the separated charged particles simultaneously.

13. The scanning electron microscope according to claim 12, wherein the energy analyzer has an inner spherical electrode and an outer spherical electrode which are formed by a material composed mainly of an element having low atomic number.

14. The scanning electron microscope according to claim 12, wherein the energy analyzer is configured to measure an amount of energy loss of back scattered electrons to thereby determine a depth at which the back scattered electrons have been generated in the specimen.

15. The scanning electron microscope according to claim 14 is able to display depth resolved scanning images.

16. The scanning electron microscope according to claim 1, further comprising:
a field control plate arranged below the combined objective lens; and
a FCP control power source coupled to the field control plate and the retarding power source.

* * * * *